(12) United States Patent
Kim et al.

(10) Patent No.: US 12,322,693 B2
(45) Date of Patent: Jun. 3, 2025

(54) INTEGRATED CIRCUIT

(71) Applicant: SAMSUNG ELECTRONICS CO., LTD., Suwon-si (KR)

(72) Inventors: Shin Woo Kim, Hwaseong-si (KR); Chang Beom Kim, Tongyeong-si (KR); Jae Ha Lee, Yongin-si (KR); Doo Hee Cho, Goyang-si (KR); Jae Wan Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 819 days.

(21) Appl. No.: 17/511,999

(22) Filed: Oct. 27, 2021

(65) Prior Publication Data
US 2022/0270966 A1 Aug. 25, 2022

(30) Foreign Application Priority Data
Feb. 22, 2021 (KR) ........................ 10-2021-0023160

(51) Int. Cl.
*H01L 23/522* (2006.01)
*H01L 23/528* (2006.01)
(Continued)

(52) U.S. Cl.
CPC ...... *H01L 23/5223* (2013.01); *H01L 23/5286* (2013.01); *H10D 30/6211* (2025.01);
(Continued)

(58) Field of Classification Search
CPC ....... H01L 21/02603; H01L 21/823431; H01L 21/823821; H01L 21/845; H01L 23/5223; H01L 23/5286; H01L 27/0886; H01L 27/0921; H01L 27/1211; H01L 29/0665; H01L 29/0669; H01L 29/0673;
(Continued)

(56) References Cited

U.S. PATENT DOCUMENTS 5,656,834 A 8/1997 Grzyb et al.
6,608,365 B1 8/2003 Li et al.
(Continued)

OTHER PUBLICATIONS

Korean Request for the Submission of an Opinion dated Apr. 10, 20215, in connection with Korean Application No. 10-2021-0023160, with English translation thereof.

*Primary Examiner* — David C Spalla
(74) *Attorney, Agent, or Firm* — Wolf, Greenfield & Sacks, P.C.

(57) ABSTRACT

An integrated circuit includes first power supply lines which extend in a first direction and are spaced apart from each other in a second direction different from the first direction. A second power supply line extends in the first direction and is placed between the first power supply lines adjacent to each other in the second direction. A decoupling filler cell is placed between the first power supply lines adjacent to each other in the second direction. The decoupling filler cell includes a decoupling capacitor region formed by a gate electrode and a decap transistor including a first source/drain region of a first conductive type. The gate electrode is connected to the second power supply line, the first source/drain region is connected to the first power supply lines, and the second power supply line passes through the decoupling capacitor region.

20 Claims, 31 Drawing Sheets

(51) Int. Cl.
*H01L 27/092* (2006.01)
*H01L 29/06* (2006.01)
*H01L 29/417* (2006.01)
*H01L 29/423* (2006.01)
*H01L 29/78* (2006.01)
*H10D 30/62* (2025.01)
*H10D 30/67* (2025.01)
*H10D 62/10* (2025.01)
*H10D 84/85* (2025.01)

(52) U.S. Cl.
CPC ..... *H10D 30/6219* (2025.01); *H10D 30/6729* (2025.01); *H10D 30/6735* (2025.01); *H10D 30/6757* (2025.01); *H10D 62/118* (2025.01); *H10D 84/85* (2025.01)

(58) Field of Classification Search
CPC ......... H01L 29/41791; H01L 29/66439; H01L 29/66636; H01L 29/66795; H01L 29/775; H01L 29/7848; H01L 29/785; H01L 29/7851; H01L 29/7853; H01L 29/7855; H01L 29/78618; H01L 2029/7858; H10D 30/024; H10D 30/62; H10D 30/6211; H10D 30/6219; H10D 30/6713; H10D 30/6729; H10D 30/6735; H10D 30/6757; H10D 30/797; H10D 62/021; H10D 62/118; H10D 62/121; H10D 84/013; H10D 84/017; H10D 84/834
See application file for complete search history.

(56) References Cited

U.S. PATENT DOCUMENTS

| | | |
|---|---|---|
| 7,227,211 B2 * | 6/2007 | Tsutsumi ............. H10D 84/217 257/532 |
| 7,302,660 B2 | 11/2007 | Shimamura |
| 7,329,938 B2 | 2/2008 | Kinoshita |
| 7,638,821 B2 | 12/2009 | Aoki |
| 7,709,301 B2 | 5/2010 | Bosshart |
| 8,946,856 B2 * | 2/2015 | Pereira ............. H01L 27/11807 257/532 |
| 9,928,337 B2 * | 3/2018 | Gothi .................... G06F 30/327 |
| 11,769,764 B2 * | 9/2023 | Trester ................ H01L 27/0207 257/369 |
| 2007/0252217 A1 * | 11/2007 | Oki ........................ H10D 89/10 257/369 |
| 2012/0286331 A1 | 11/2012 | Aton et al. |
| 2020/0104446 A1 | 4/2020 | Li et al. |
| 2020/0273857 A1 * | 8/2020 | Li ....................... H01L 23/5223 |

* cited by examiner

INTEGRATED CIRCUIT

CROSS-REFERENCE TO RELATED APPLICATION

This application claims priority from Korean Patent Application No. 10-2021-0023160 filed on Feb. 22, 2021, in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to an integrated circuit and, particularly, to an integrated circuit including a decoupling filler cell.

2. Description of the Related Art

Recently, speeding-up and highly integrating semiconductor integrated circuits has been progressing with increased functionality of digital circuits. Due to the speeding-up and high integration of the semiconductor integrated circuits, the power consumption of chips increases and the accompanying power supply voltage drop (IR-DROP) becomes a problem. The operating speed of the transistor drops due to the power supply voltage drop, and the operating frequency of the circuit may drop. Alternatively, as the power supply voltage drops, the noise margin drops, incorrect latch or the like of data occurs, and problems such as circuit malfunction may occur.

To improve speed of semiconductor integrated circuits and stability of circuit operation, decoupling capacitors may be placed for each of several standard cells. The decoupling capacitor is inserted between a power supply line and a ground line. The decoupling capacitor may be inserted to prevent an occurrence of power supply voltage drop inside the semiconductor integrated circuit.

SUMMARY

Aspects of the present disclosure provide an integrated circuit capable of improving performance and reliability of a designed semiconductor device, using a decoupling filler cell.

According to some aspects of the present disclosure, there is provided an integrated circuit comprising first power supply lines which extend in a first direction and are spaced apart from each other in a second direction different from the first direction. A second power supply line extends in the first direction and is placed between the first power supply lines adjacent to each other in the second direction. A decoupling filler cell is placed between the first power supply lines adjacent to each other in the second direction. The decoupling filler cell includes a decoupling capacitor region formed by a gate electrode and a decap transistor including a first source/drain region of a first conductive type. The gate electrode is connected to the second power supply line, the first source/drain region is connected to the first power supply lines, and the second power supply line passes through the decoupling capacitor region.

According to some aspects of the present disclosure, there is provided an integrated circuit comprising first power supply lines which extend in a first direction and are spaced apart from each other in a second direction different from the first direction. A second power supply line extends in the first direction and is placed between the first power supply lines adjacent to each other in the second direction. A decoupling filler cell is placed between the first power supply lines adjacent to each other in the second direction and includes a gate electrode extending in the second direction. A standard cell is placed between the first power supply line and the second power supply line and forms a boundary with the decoupling filler cell in the first direction. The decoupling filler cell includes a decoupling capacitor region, a decoupling buffer region, and a decoupling tap region. The decoupling buffer region is defined along a decoupling filler cell boundary extending in the second direction. The decoupling tap region is defined between the decoupling capacitor region and the decoupling buffer region. The decoupling capacitor region is formed by the gate electrode and a decap transistor including a first source/drain region of a first conductive type. The decoupling tap region includes a tap source/drain region of the first conductive type. The decoupling buffer region includes a buffer source/drain region of the second conductive type different from the first conductive type. The standard cell has a first active region which is adjacent to the first power supply line and has a second_1 source/drain region of the first conductive type and a second active region which is adjacent to the second power supply line and has a second_2 source/drain region of the second conductive type. Each of the gate electrode and the tap source/drain region is connected to the second power supply line. The first source/drain region is connected to the first power supply line. The second power supply line passes through the decoupling capacitor region, the decoupling tap region, and the decoupling buffer region.

According to some aspects of the present disclosure, there is provided an integrated circuit comprising first power supply lines which extend in a first direction and are spaced apart from each other in a second direction different from the first direction. A second power supply line extends in the first direction and is placed between the first power supply lines adjacent to each other in the second direction. A decoupling filler cell is placed between the first power supply lines adjacent to each other in the second direction. The decoupling filler cell includes a plurality of gate electrodes extending in the second direction and a plurality of first multi-channel active patterns and a plurality of second multi-channel active patterns extending in the first direction. Each of the second multi-channel active patterns is separated from the corresponding first multi-channel active pattern in the first direction. The decoupling filler cell includes a decoupling capacitor region, a decoupling buffer region, and a decoupling tap region. The decoupling buffer region is defined along a decoupling filler cell boundary extending in the second direction. The decoupling tap region is defined between the decoupling capacitor region and the decoupling buffer region. The decoupling capacitor region is formed by the first multi-channel active pattern, the gate electrode, and a p-type transistor including a p-type source/drain region on the first multi-channel active pattern. The decoupling tap region includes a p-type tap source/drain region on the second multi-channel active pattern. The decoupling buffer region includes an n-type buffer source/drain region on the second multi-channel active pattern. The gate electrode of the p-type transistor is connected to the second power supply line. Each of the source/drain region and the tap source/drain region of the p-type transistor is connected to the first power supply line, and the second power supply line is connected to a ground voltage.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

In the following description, an integrated circuit of various embodiments formed on a substrate (100 of FIG. 4), for example, a semiconductor substrate is provided. The integrated circuit has a layout that includes various standard cells. The standard cells are integrated circuit structures that are predesigned for repeated use in the design of individual integrated circuits. Effective integrated circuit design layouts include various predesigned standard cells and predefined rules concerning placement of the standard cells to enhance circuit performance and reduce a circuit area.

The integrated circuit according to some embodiments includes one or more standard cells placed in the integrated circuit layout by a predefined rule. Such standard cells are repeatedly used in the integrated circuit design. Therefore, the standard cells are predesigned in accordance with fabricating techniques and stored in the standard cell library. An integrated circuit designer may search for such standard cells, include the standard cells in an integrated circuit design, and place the standard cells in an integrated circuit layout in accordance with a predefined placement rule.

The standard cell may include various basic circuit devices that are often used in the design of digital circuits for electronic devices, such as a central processing unit (CPU), a graphics processing unit (GPU), and a system-on-chip (SOC) design, like an inverter, an AND, a NAND, an OR, an XOR, and a NOR. The standard cell may include other basic circuit devices that are often used in a circuit block, like a flip-flop and a latch.

A filler cell may be a designed block of the integrated circuit inserted between two adjacent standard cells to comply with integrated circuit design and integrated circuit fabricating rules. Proper design and arrangement of the standard cells and the filler cells may enhance packing density and circuit performance.

A decoupling filler cell including a decoupling capacitor may be a designed block of the integrated circuit inserted between the standard cells to prevent power supply voltage drop (IR-DROP).

Figure 1:
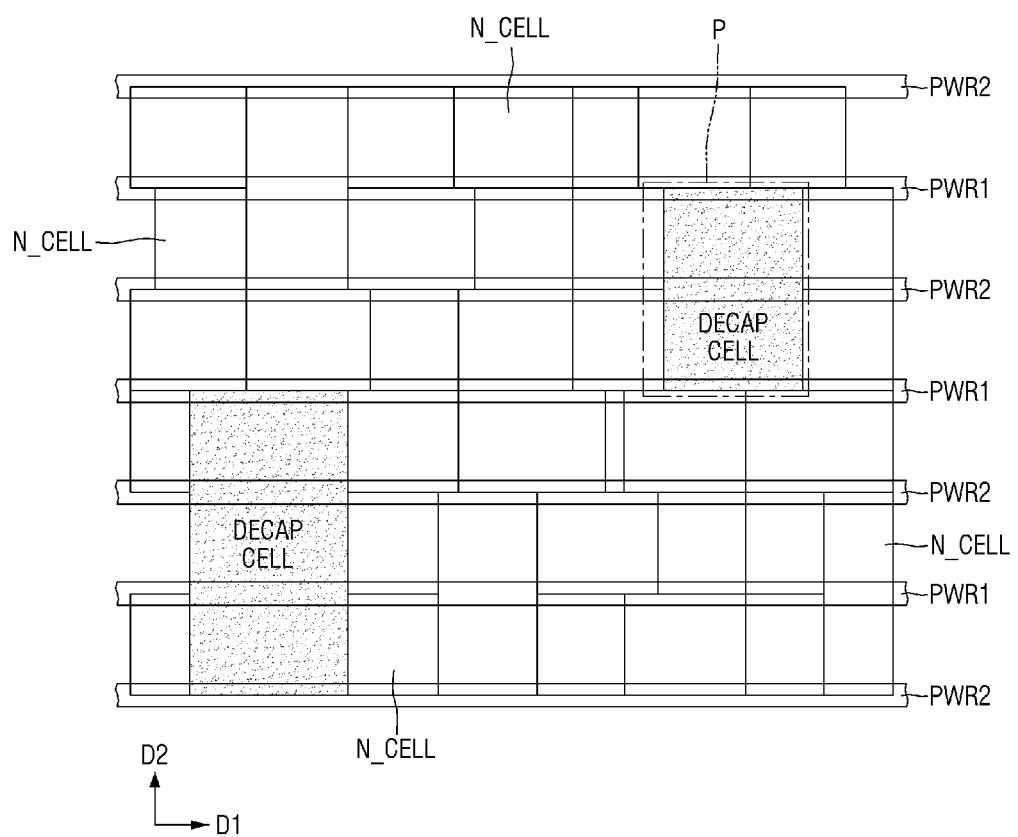
FIG. 1 is an exemplary diagram for explaining an integrated circuit according to some embodiments.
Figure 2:
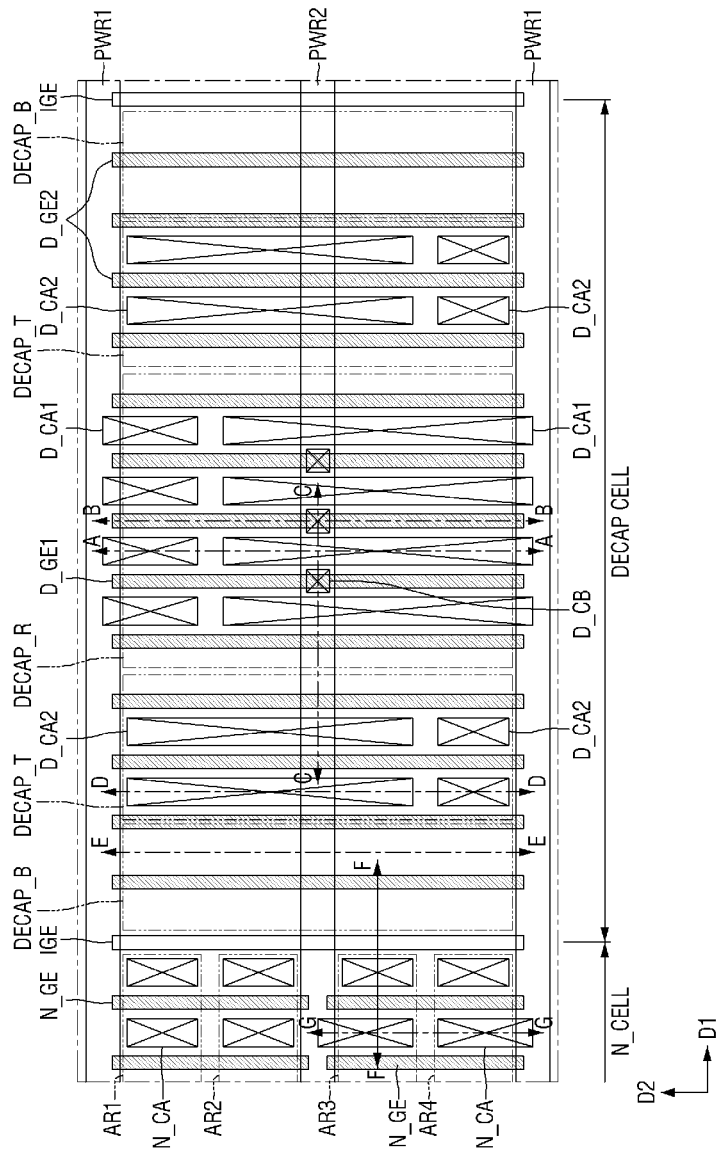
FIG. 2 is an exemplary layout diagram in which a portion P of FIG. 1 is enlarged.
Figure 3A:
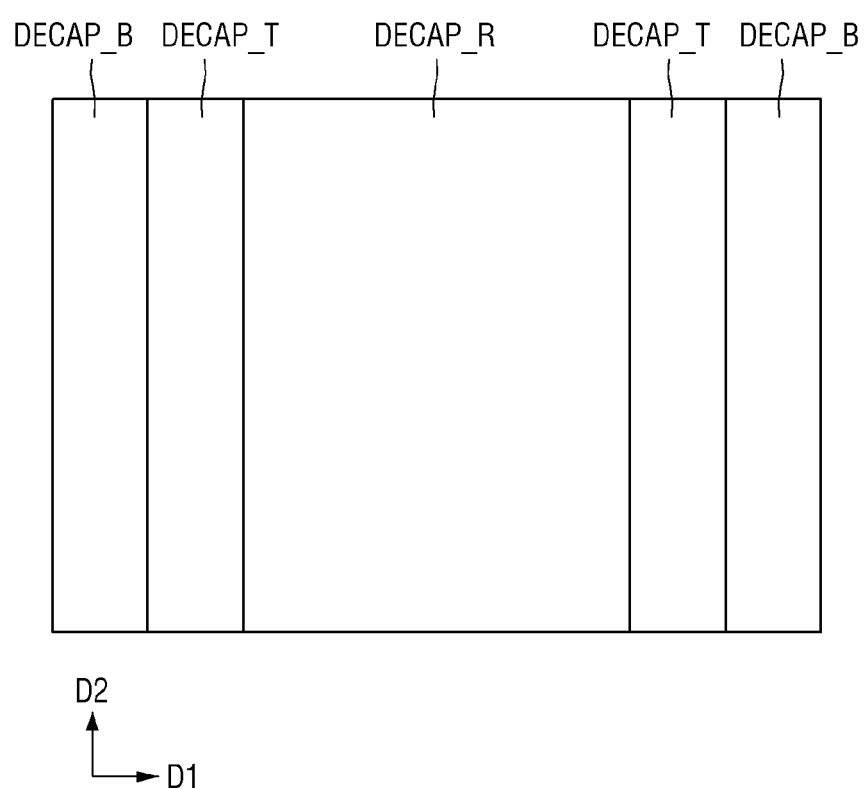
FIG. 3A is a diagram for explaining a shape of a decoupling filler cell of FIG. 2.
Figure 3B:
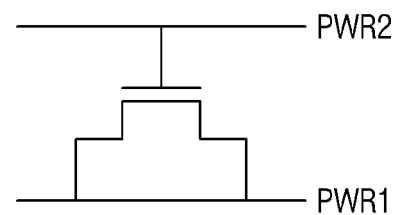
FIG. 3B is a circuit diagram for explaining a decoupling capacitor region of FIG. 2.

FIG. 1 is an exemplary diagram for explaining an integrated circuit according to some embodiments. FIG. 2 is an exemplary layout diagram in which a portion P of FIG. 1 is enlarged. FIG. 3A is a diagram for explaining a shape of a decoupling filler cell of FIG. 2. FIG. 3B is a circuit diagram for explaining a decoupling capacitor region of FIG. 2. FIGS. 4 to 10 are exemplary cross-sectional views taken along A-A, B-B, C-C, D-D, E-E, F-F, and G-G of FIG. 2.

For reference, FIG. 2 is a diagram showing a part of a decoupling filler cell DECAP CELL of FIG. 1 and a peripheral normal cell N_CELL.

Referring to FIG. 1, the integrated circuit according to some embodiments may include a plurality of normal cells N_CELL, at least one or more decoupling filler cells DECAP CELL, a plurality of first power supply lines PWR1, and a plurality of second power supply lines PWR2.

Each first power line PWR1 may extend in a first direction D1. Each first power line PWR1 may be spaced apart from others in a second direction D2. Each second power supply line PWR2 may extend in the first direction D1. Each second power supply line PWR2 may be spaced apart from others in the second direction D2. The first power supply line PWR1 and the second power supply line PWR2 may be placed alternately along the second direction D2. For example, the second power supply line PWR2 may be placed between the first power supply lines PWR1 adjacent to each other in the second direction D2.

The first power supply line PWR1 and the second power supply line PWR2 are connected to power supply voltages different from each other. As an example, the first power supply line PWR1 may be connected to a power voltage Vdd, and the second power supply line PWR2 may be connected to a ground voltage Vss. As another example, the first power supply line PWR1 may be connected to the ground voltage Vss, and the second power supply line PWR2 may be connected to the power voltage Vdd. The meanings of the power voltage Vdd and the ground voltage Vss are obvious to engineers belonging to the technical field of the present disclosure.

The normal cell N_CELL may include a standard cell and a filler cell. The decoupling filler cell DECAP CELL may be inserted between the normal cells N_CELL arranged in the first direction D1 and the second direction D2. The normal cell N_CELL may include a single height cell and a multi height cell. The cell height may be a height of the cell in the second direction D2. Here, H which is a standard of the cell height may be a gap between the first power supply line PWR1 and the second power supply line PWR2 which are closest to each other in the second direction D2. For example, the cell height of the single height cell is 1H.

In the integrated circuits according to some embodiments of the present disclosure, at least one of the decoupling filler cells DECAP CELL may be a multi height cell. Although not shown, the integrated circuit may also include a decoupling filler cell DECAP CELL having a single height.

For example, the decoupling filler cell DECAP CELL having the multi height may include a first decoupling filler cell and a second decoupling filler cell. As an example, the cell height of the first decoupling filler cell may differ from the cell height of the second decoupling filler cell. Unlike that shown, as another example, the cell height of the first decoupling filler cell may be the same as the cell height of the second decoupling filler cell.

The following description will focus on the decoupling filler cell DECAP CELL, which has a cell height of 2H. Further, the normal cell N_CELL will be described as a standard cell.

Referring to FIGS. 1 to 10, the decoupling filler cell DECAP CELL may be placed between the first power supply lines PWR1 adjacent to each other in the second direction D2. The second power supply line PWR2 placed between the first power supply lines PWR1 may pass through the decoupling filler cell DECAP CELL. For example, the second power supply line PWR2 may pass the upper part of the decoupling filler cell DECAP CELL.

The normal cell N_CELL may be placed between the first power supply line PWR1 and the second power supply line PWR2. The normal cell N_CELL may form a boundary with the decoupling filler cell DECAP CELL in the first direction D1. That is, the boundary between the decoupling filler cell DECAP CELL and the normal cell N_CELL may extend in the second direction D2.

Although a plurality of normal cells N_CELL that form the boundary with the decoupling filler cell DECAP CELL in the first direction D1 are shown, the embodiment is not limited thereto. When the normal cell N_CELL that forms the boundary with the decoupling filler cell DECAP CELL is the multi height cell, the decoupling filler cell DECAP CELL may form a boundary with a single normal cell N_CELL.

The decoupling filler cell DECAP CELL may include a decoupling capacitor region DECAP_R, a decoupling buffer region DECAP_B, and a decoupling tap region DECAP_T.

The decoupling capacitor region DECAP_R may serve as a decoupling capacitor. The decoupling capacitor region DECAP_R has a multi height. The decoupling capacitor region DECAP_R may be formed by a decap transistor (D_TR of FIG. 6). A decap transistor D_TR includes a first decap gate electrode D_GE1 and a decap source/drain region (D_SDR of FIG. 6) placed on at least one side of the first decap gate electrode D_GE1.

In FIG. 3B, the first decap gate electrode D_GE1 may be connected to the second power supply line PWR2. A decap source/drain region D_SDR may be connected to the first power supply line PWR1. The decoupling capacitor region DECAP_R may operate as a capacitor accordingly.

The decoupling buffer region DECAP_B may be defined along the boundary of the decoupling filler cell DECAP CELL extending in the second direction D2. That is, the normal cell N_CELL may form a boundary with the decoupling buffer region DECAP_B of the decoupling filler cell DECAP CELL in the first direction D1.

The decoupling tap region DECAP_T may be defined between the decoupling capacitor region DECAP_R and the decoupling buffer region DECAP_B. The decoupling tap region DECAP_T may serve as a tap cell that holds the body voltage of the transistor included in the normal cell N_CELL. The tap source/drain region (D_SDT of FIG. 6) included in the decoupling tap region DECAP_T may be connected to the second power supply line PWR2.

In the integrated circuit according to some embodiments, the decoupling capacitor region DECAP_R may have an "I" shape that extends in the second direction D2. That is, the width of the decoupling capacitor region DECAP_R in the first direction D1 may be constant.

In FIG. 3A, the decoupling buffer region DECAP_B and the decoupling tap region DECAP_T may each have an "I" shape that extends in the second direction D2. Further, the decoupling capacitor region DECAP_R, the decoupling buffer region DECAP_B, and the decoupling tap region DECAP_T may each have a multi height.

In other words, each of the height of the decoupling capacitor region DECAP_R, the height of the decoupling buffer region DECAP_B, and the height of the decoupling tap region DECAP_T may be the same as the cell height of the decoupling filler cell DECAP CELL.

The second power supply line PWR2 may pass the upper part of the decoupling capacitor region DECAP_R, the decoupling buffer region DECAP_B, and the decoupling tap region DECAP_T. The structures of the decoupling capacitor region DECAP_R, the decoupling buffer region DECAP_B, and the decoupling tap region DECAP_T will be described below.

The normal cell N_CELL may include a first normal cell and a second normal cell. The first normal cell may include a first active region AR1 and a second active region AR2. The second normal cell may include a third active region AR3 and a fourth active region AR4. For example, each of the first to fourth active regions AR1, AR2, AR3, and AR4 may be transistor formation regions.

The second active region AR2 and the third active region AR3 may be placed adjacent to the second power supply line PWR2. That is, the second power supply line PWR2 may pass between the second active region AR2 of the first normal cell and the third active region AR3 of the second normal cell. The first active region AR1 and the fourth active region AR4 may be placed adjacent to the first power supply line PWR1.

For example, the second active region AR2 of the first normal cell and the third active region AR3 of the second normal cell are transistor formation regions of the same conductive type. The first active region AR1 of the first normal cell and the fourth active region AR4 of the second normal cell are transistor formation regions of the same conductive type.

As an example, the first power supply line PWR1 may be connected to the power voltage Vdd, and the second power supply line PWR2 may be connected to the ground voltage Vss. The decap transistor (D_TR of FIG. 6) which forms the decoupling capacitor region DECAP_R may be a p-type transistor. The second active region AR2 of the first normal cell and the third active region AR3 of the second normal cell may be n-type transistor formation regions. The first active region AR1 of the first normal cell and the fourth active region AR4 of the second normal cell may be p-type transistor formation regions.

When the decap transistor D_TR is a p-type transistor, the decoupling capacitor region DECAP_R may include an n-type well region including n-type impurities. On the other hand, the decoupling buffer region DECAP_B and the decoupling tap region DECAP_T may include a p-type well region including p-type impurities. When the substrate (100 of FIG. 4) is a semiconductor substrate having p-type impurities, a part of the substrate 100 may be used as a p-type well region.

As another example, the first power supply line PWR1 may be connected to the ground voltage Vss, and the second power supply line PWR2 may be connected to the power voltage Vdd. The decap transistor D_TR which forms the decoupling capacitor region DECAP_R may be an n-type transistor. The second active region AR2 of the first normal cell and the third active region AR3 of the second normal cell may be a p-type transistor formation region. The first active region AR1 of the first normal cell and the fourth active region AR4 of the second normal cell may be n-type transistor formation regions.

When the decap transistor D_TR is an n-type transistor, the decoupling capacitor region DECAP_R may include a p-type well region including p-type impurities. On the other hand, the decoupling buffer region DECAP_B and the decoupling tap region DECAP_T may include an n-type well region including n-type impurities.

In FIGS. 2 to 8, the decoupling filler cell DECAP CELL may include a plurality of first decap fin type patterns DE_F1, a plurality of second decap fin type patterns DE_F2, a plurality of decap gate electrodes D_GE1 and D_GE2, a plurality of decap source/drain regions D_SDR, a plurality of tap source/drain regions D_SDT, a plurality of buffer source/drain regions D_SDB, a plurality of decap source/drain contacts D_CA1 a plurality of tap source/drain contacts D_CA2, and a plurality of decap gate contacts D_CB.

The substrate 100 may be a silicon substrate or an SOI (silicon-on-insulator). In contrast, the substrate 100 may include, but is not limited to, silicon germanium, SGOI (silicon germanium on insulator), indium antimonide, lead tellurium compounds, indium arsenic, indium phosphide, gallium arsenide or gallium antimonide.

A first decap fin type pattern DE_F1 and the second decap fin type pattern DE_F2 may each protrude from the substrate 100. The first decap fin type pattern DE_F1 and the second decap fin type pattern DE_F2 may each extend long in the first direction D1. The adjacent first decap fin type patterns DE_F1 may be spaced apart from each other in the second direction D2, and the adjacent second decap fin type patterns DE_F2 may be spaced apart from each other in the second direction D2.

The first decap fin type pattern DE_F1 may be placed in the decoupling capacitor region DECAP_R. The second decap fin type pattern DE_F2 may be placed in the decoupling buffer region DECAP_B and the decoupling tap region DECAP_T. The first decap fin type pattern DE_F1 and the second decap fin type pattern DE_F2 corresponding to each other may be arranged along the first direction D1.

The decoupling capacitor region DECAP_R and the decoupling tap region DECAP_T may be divided through a position at which the first decap fin type pattern DE_F1 and the second decap fin type pattern DE_F2 are spaced apart from each other in the first direction D1.

Although not shown, as an example, the second decap fin type patterns DE_F2 are not spaced apart from each other in the second direction D2 and may be placed over the decoupling buffer region DECAP_B and the decoupling tap region DECAP_T.

Although not shown, as another example, the second decap fin type pattern DE_F2 may include a first portion and a second portion spaced apart from each other in the second direction D2. The first portion of the second decap fin type pattern DE_F2 is placed in the decoupling tap region DECAP_T, and the second portion of the second decap fin type pattern DE_F2 may be placed in the decoupling buffer region DECAP_B. As an example, as in FIG. 6 in which the first decap fin type pattern DE_F1 and the second decap fin type pattern DE_F2 are separated, the first portion of the second decap fin type pattern DE_F2 and the second portion of the second decap fin type pattern DE_F2 may be separated. As another example, as in FIG. 9 in which the second decap fin type pattern DE_F2 and the normal fin type pattern N_F are separated, the first portion of the second decap fin type pattern DE_F2 and the second portion of the second decap fin type pattern DE_F2 may be separated.

The first decap fin type pattern DE_F1 and the second decap fin type pattern DE_F2 may be defined by fin trenches. For example, the boundary of the decoupling filler cell DECAP CELL extending in the first direction D1 may be defined by a deep trench that is deeper than the fin trench. The fin type pattern placed in the outermost part of the first decap fin type pattern DE_F1 and the second decap fin type pattern DE_F2 may be immediately adjacent to the deep trench. Here, the expression "immediately adjacent" means that no other fin trench is placed between the deep trench and the fin trench.

The first decap fin type pattern DE_F1 and the second decap fin type pattern DE_F2 may also be placed at a position where they overlap the second power supply line PWR2 in a thickness direction (hereinafter referred to as a vertical direction) of the substrate 100. The vertical direction may be perpendicular to the first direction D1 and the second direction D2. The first direction D1 may be perpendicular to the second direction D2.

Each of the first decap fin type pattern DE_F1 and the second decap fin type pattern DE_F2 may each be a multi-channel active pattern. The first decap fin type pattern DE_F1 and the second decap fin type pattern DE_F2 may each be a part of the substrate 100 and include an epitaxial layer that is grown from the substrate 100. Each of the first decap fin type pattern DE_F1 and the second decap fin type pattern DE_F2 may include, for example, silicon or germanium which is an elemental semiconductor material. Further, each of the first decap fin type pattern DE_F1 and the second decap fin type pattern DE_F2 may include a compound semiconductor material, and may include, for example, a group IV-IV compound semiconductor material or a group III-V compound semiconductor.

A field insulating film 105 may be formed on the substrate 100. The field insulating film 105 may be formed on a part of the side walls of each of the first decap fin type pattern DE_F1 and the second decap fin type pattern DE_F2. The field insulating film 105 may fill a part of the fin trench and the deep trench. Each of the first decap fin type pattern DE_F1 and the second decap fin type pattern DE_F2 may protrude upward from the upper surface of the field insulating film 105. The field insulating film 105 may include an insulating material.

Each of the plurality of decap gate electrodes D_GE1 and D_GE2 may extend in the second direction D2. A plurality of decap gate electrodes D_GE1 and D_GE2 may be placed on the field insulating film 105.

The plurality of decap gate electrodes D_GE1 and D_GE2 include a first decap gate electrode D_GE1 and a second decap gate electrode D_GE2. The first decap gate electrode D_GE1 may intersect the first decap fin type pattern DE_F1. The first decap gate electrode D_GE1 does not intersect the second decap fin type pattern DE_F2.

The second decap gate electrode D_GE2 may intersect the second decap fin type pattern DE_F2. In the integrated circuit according to some embodiments, the second decap gate electrode D_GE2 may not intersect the first decap fin type pattern DE_F1.

In the integrated circuits according to some embodiments, the first decap gate electrode D_GE1 is placed in the decoupling capacitor region DECAP_R, but is not placed in the decoupling buffer region DECAP_B and the decoupling tap region DECAP_T. The second decap gate electrode D_GE2 is placed in the decoupling buffer region DECAP_B and the decoupling tap region DECAP_T, but is not placed in the decoupling capacitor region DECAP_R.

A first outermost gate electrode placed in the outermost part of the first decap gate electrode D_GE1 intersects the end of the first decap fin type pattern DE_F1. The first outermost gate electrode may wrap the end of the first decap fin type pattern DE_F1.

A second outermost gate electrode placed in the outermost part of the second decap gate electrode D_GE2 intersects the end of the second decap fin type pattern DE_F2. The second outermost gate electrode may wrap the end of the second decap fin type pattern DE_F2.

Each of the first decap gate electrode D_GE1 and the second decap gate electrode D_GE2 includes a conductive material. Although each of the first decap gate electrode D_GE1 and the second decap gate electrode D_GE2 is shown as a single film, this is merely for convenience of explanation, and the embodiment is not limited thereto.

A gate separation structure GCS may be placed along the boundary of the decoupling filler cell DECAP CELL extending in the first direction D1. The gate separation structure GCS may be placed on the field insulating film 105. For example, the gate separation structure GCS may be placed at a position where it perpendicularly overlaps the deep trench.

Each of the first decap gate electrode D_GE1 and the second decap gate electrode D_GE2 may be placed between the gate separation structures GCS adjacent to each other in the second direction D2. The gate separation structure GCS includes, for example, an insulating material.

The first decap gate spacer D_GSP1 may be placed on the side wall of the first decap gate electrode D_GE1. The second decap gate spacer D_GSP2 may be placed on the side wall of the second decap gate electrode D_GE2. Each of the first decap gate spacer D_GSP1 and the second decap gate spacer D_GSP2 includes an insulating material.

A first decap gate insulating film D_GI1 may extend along the side walls and the bottom surface of the first decap gate electrode D_GE1. A second decap gate insulating film D_GI2 may extend along the side walls and the bottom surface of the first decap gate electrode D_GE1.

Figure 5A:
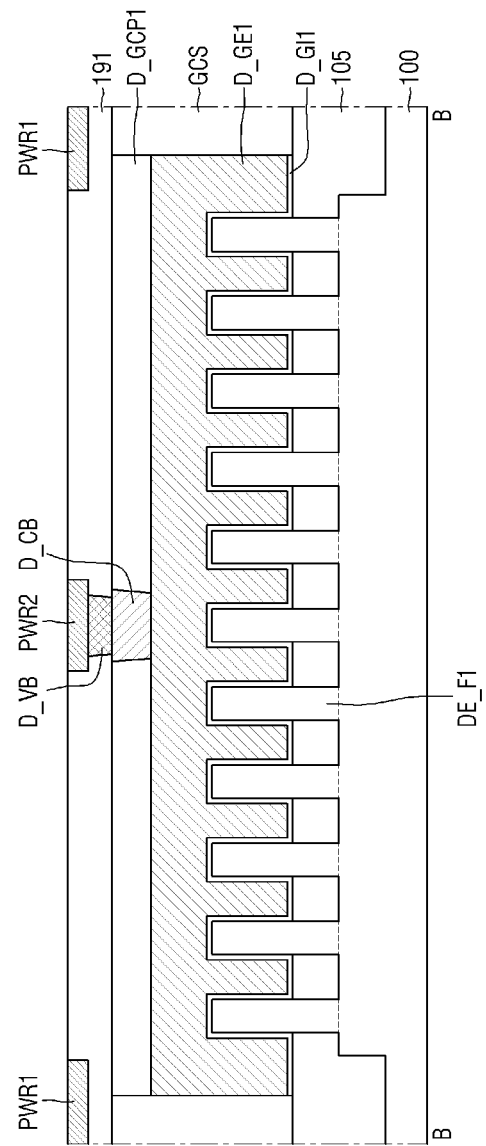
Figure 5B:
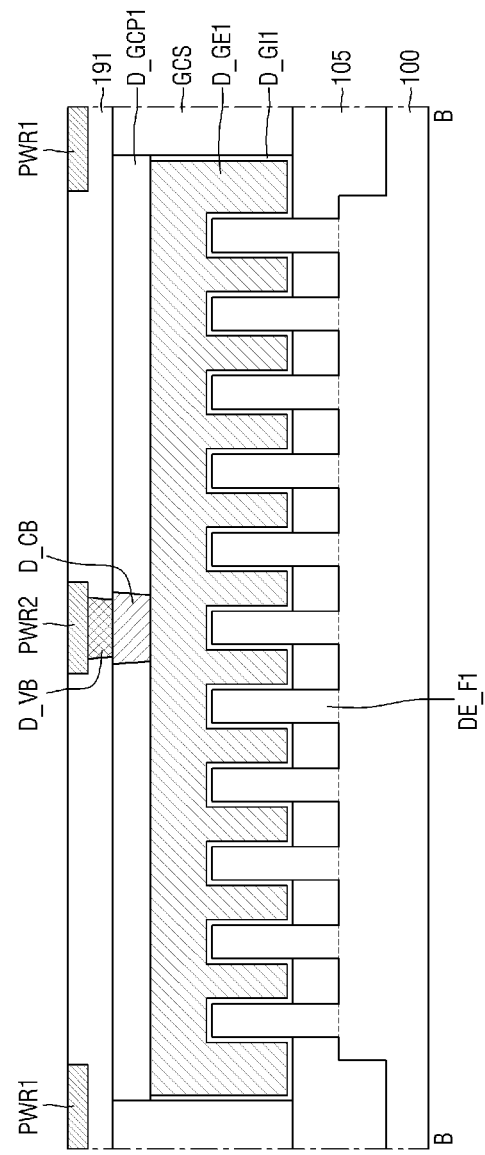
Figure 6:
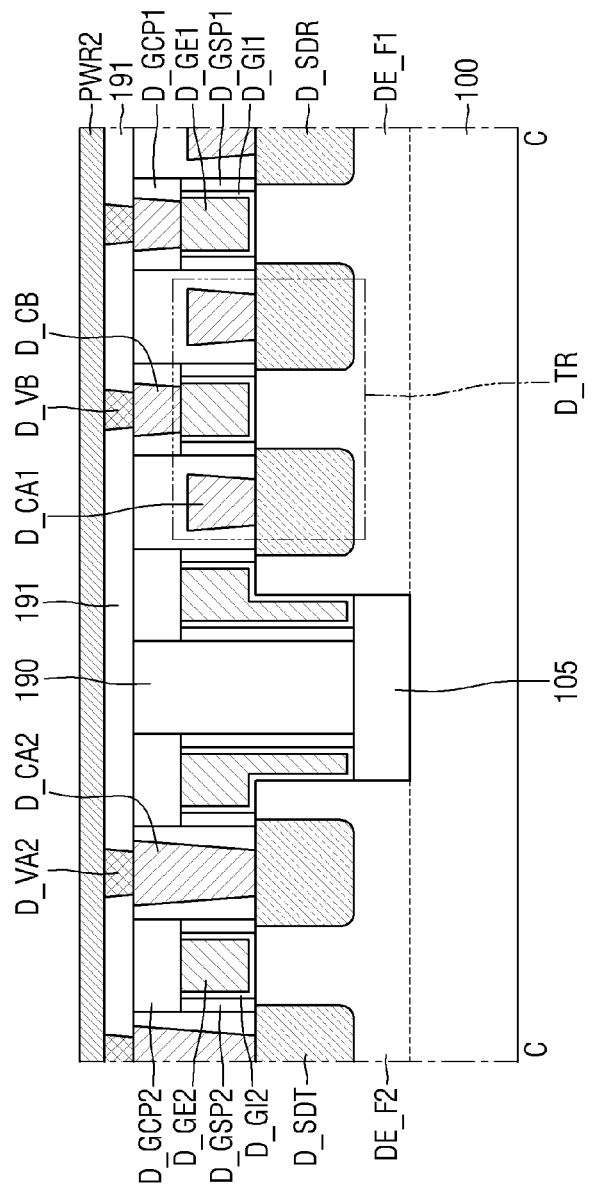
Figure 7:
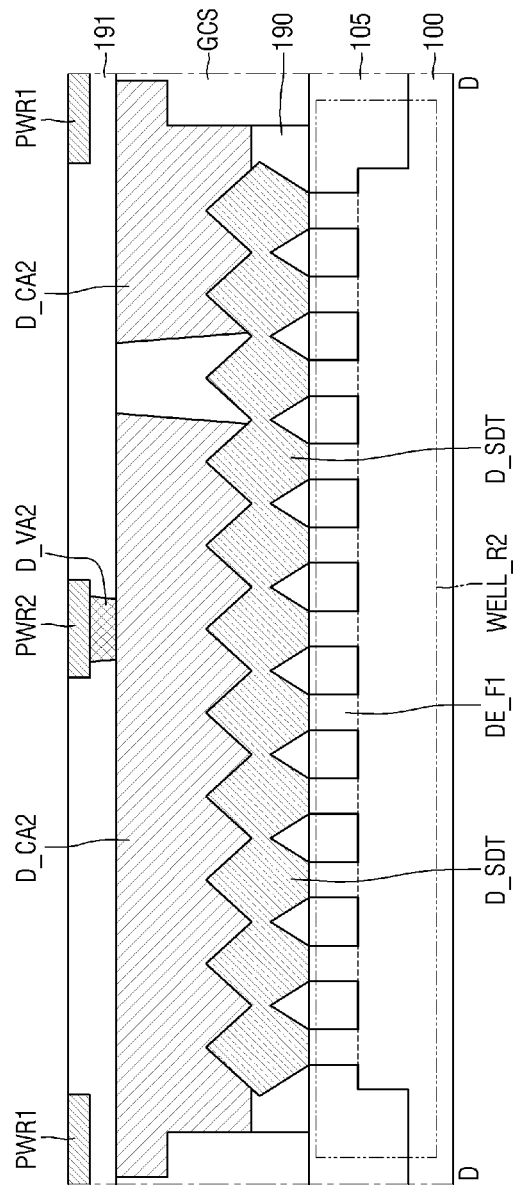
Figure 8:
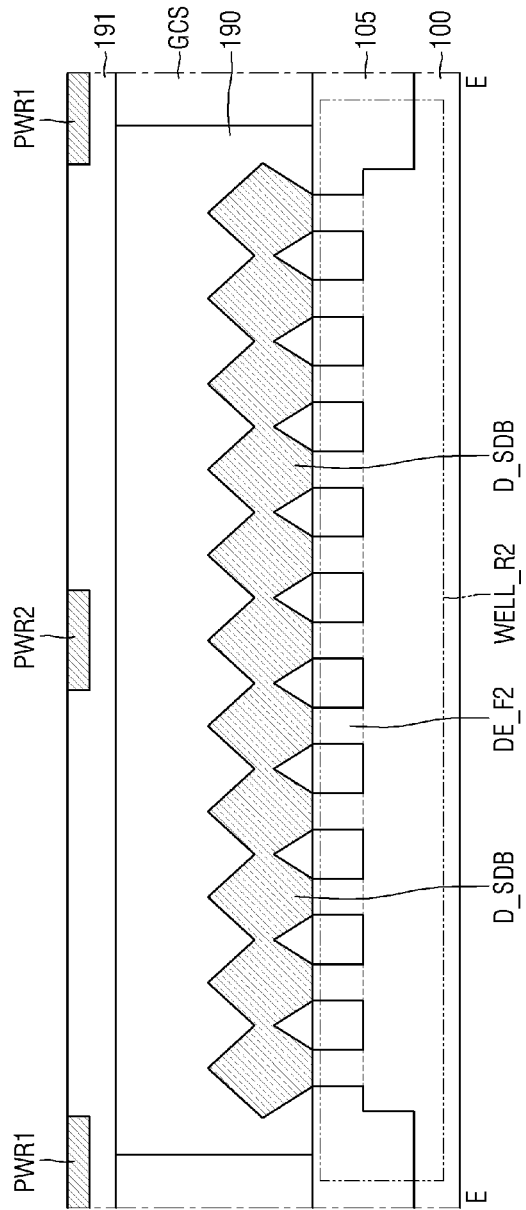

Taking the first decap gate insulating film D_GI1 as an example, the first decap gate insulating film D_GI1 may be formed along a profile of the first decap fin type pattern DE_F1 protruding upward from the field insulating film 105 and the upper surface of the field insulating film 105. In FIG. 5A, the first decap gate insulating film D_GI1 does not extend along the side wall of the gate separation structure GCS. In FIG. 5B, the first decap gate insulating film D_GI1 extends along the side walls of the gate separation structure GCS.

Each of the first decap gate insulating film D_GI1 and the second decap gate insulating film D_GI2 may include an insulating material. As an example, each of the first decap gate insulating film D_GI1 and the second decap gate insulating film D_GI2 may include a paraelectric material film having a paraelectric property. As another example, each of the first decap gate insulating film D_GI1 and the second decap gate insulating film D_GI2 may include a ferroelectric material film having a ferroelectric property and paraelectric material film having a paraelectric property.

First and second decap gate capping patterns D_GCP1 and D_GCP2 may be placed on the upper surfaces of the first and second decap gate electrodes D_GE1 and D_GE2. Each of the first and second decap gate capping patterns D_GCP1 and D_GCP2 includes an insulating material.

Unlike that shown, the first and second decap gate capping patterns D_GCP1 and D_GCP2 may not be placed on the upper surfaces of the first and second decap gate electrodes D_GE1 and D_GE2. In such a case, the upper surfaces of the first and second decap gate electrodes D_GE1 and D_GE2 may be placed in the same plane as an upper surface of a first interlayer insulating film 190 to be described below.

The decap source/drain region D_SDR may be placed in the decoupling capacitor region DECAP_R. The decoupling capacitor region DECAP_R may include the decap source/drain region D_SDR.

The decap source/drain region D_SDR may be placed on the first decap fin type pattern DE_F1. The decap source/drain region D_SDR may include, but is not limited to, a semiconductor epitaxial pattern formed through an epitaxial process. Although the decap source/drain regions D_SDR placed on each first decap fin type pattern DE_F1 are shown as being connected to each other, the embodiment is not limited thereto.

The decoupling capacitor region DECAP_R may include a first well region WELL_R1 of a first conductive type. The first well region WELL_R1 of the first conductive type may include a first decap fin type pattern DE_F1 including impurities of the first conductive type and a part of the substrate 100.

The decap source/drain region D_SDR may have a second conductive type different from the first conductive type. The decap source/drain region D_SDR may include impurities of the second conductive type. The decap source/drain region D_SDR of the second conductive type may be formed on the first well region WELL_R1 of the first conductive type.

A tap source/drain region D_SDT may be placed in the decoupling tap region DECAP_T. The decoupling tap region DECAP_T may include the tap source/drain region D_SDT.

A buffer source/drain region D_SDB may be placed in the decoupling buffer region DECAP_B. The decoupling buffer region DECAP_B may include a buffer source/drain region D_SDB.

Each of the tap source/drain region D_SDT and the buffer source/drain region D_SDB may be placed on the second decap fin type pattern DE_F2. Each of the tap source/drain region D_SDT and the buffer source/drain region D_SDB may include, but is not limited to, a semiconductor epitaxial pattern.

Although the tap source/drain regions D_SDT placed on each second decap fin type pattern DE_F2 are shown as being connected to each other, the embodiment is not limited thereto. Although the buffer source/drain regions D_SDB placed on each second decap fin type pattern DE_F2 are shown as being connected to each other, the embodiment is not limited thereto.

The decoupling tap region DECAP_T and the decoupling buffer region DECAP_B may include a second well region WELL_R2 of the second conductive type. The second well region WELL_R2 of the second conductive type may include a second decap fin type pattern DE_F2 including impurities of the second conductive type and a part of the substrate 100.

The tap source/drain region D_SDT may have the second conductive type. The tap source/drain region D_SDT may include impurities of the second conductive type. The tap source/drain region D_SDT of the second conductive type may be formed on the second well region WELL_R2 of the second conductive type.

The buffer source/drain region D_SDB may have the first conductive type. The buffer source/drain region D_SDB may include impurities of the first conductive type. The buffer source/drain region D_SDB of the first conductive type may be formed on the second well region WELL_R2 of the second conductive type.

For example, the first well region WELL_R1 of the first conductive type may be an n-type well region, and the second well region WELL_R2 of the second conductive type may be a p-type well region. In such a case, the decap source/drain region D_SDR of the second conductive type may be a p-type decap source/drain region, the tap source/drain region D_SDT of the second conductive type may be a p-type tap source/drain region, and the buffer source/drain region D_SDB of the first conductive type may be an n-type buffer source/drain region. The decap transistor D_TR including the first decap gate electrode D_GE1 and the p-type decap source/drain region D_SDR is a p-type transistor. At this time, the first power supply line PWR1 may be connected to the power voltage Vdd, and the second power supply line PWR2 may be connected to the ground voltage Vss.

For example, the first well region WELL_R1 of the first conductive type may be a p-type well region, and the second well region WELL_R2 of the second conductive type may be an n-type well region. In such a case, the decap source/drain region D_SDR of the second conductive type may be an n-type decap source/drain region, the tap source/drain region D_SDT of the second conductive type may be an n-type tap source/drain region, and the buffer source/drain region D_SDB of the first conductive type may be a p-type buffer source/drain region. The decap transistor D_TR including the first decap gate electrode D_GE1 and the n-type decap source/drain region D_SDR are an n-type transistor. At this time, the first power supply line PWR1 may be connected to the ground voltage Vss, and the second power supply line PWR2 may be connected to the power voltage Vdd.

The first interlayer insulating film 190 may be placed on the field insulating film 105. The first interlayer insulating film 190 covers the decap source/drain region D_SDR, the tap source/drain region D_SDT, and the buffer source/drain region D_SDB. The upper surface of the first interlayer insulating film 190 may be placed in the same plane as the upper surfaces of the first and second decap gate capping patterns D_GCP1 and D_GCP2.

A second interlayer insulating film 191 may be placed on the first interlayer insulating film 190. Each of the first interlayer insulating film 190 and the second interlayer insulating film 191 includes an insulating material.

Each of the first power supply line PWR1 and the second power supply line PWR2 may be placed in the second interlayer insulating film 191. Each of the first power supply line PWR1 and the second power supply line PWR2 includes a conductive material.

A decap source/drain contact D_CA1 may be placed inside the first interlayer insulating film 190. The decap source/drain contact D_CA1 is placed on the decap source/drain region D_SDR. The decap source/drain contact D_CA1 is connected to the decap source/drain region D_SDR.

A first decap source/drain via D_VA1 may be placed inside the second interlayer insulating film 191. The first decap source/drain via D_VA1 may connect the decap source/drain contact D_CA1 to the first power supply line PWR1. The decap source/drain region D_SDR may be connected to the first power supply line PWR1.

In an integrated circuit according to some embodiments, the decap source/drain contact D_CA1 may include a first decap source/drain contact and a second decap source/drain contact spaced apart from each other in the second direction D2. The first power supply line PWR1 may include a first_1 power supply line and a first_2 power supply line spaced apart from each other in the second direction D2. The first_1 power supply line and the first_2 power supply line may be placed with a decoupling filler cell DECAP CELL interposed between them. Each of the first_1 power supply line and the first_2 power supply line may be placed along the boundary of the decoupling filler cell DECAP CELL extending in the first direction DE The first decap source/drain contact may be connected to the first_1 power supply line. The second decap source/drain contact may be connected to the first_2 power supply line.

A tap source/drain contact D_CA2 may be placed inside the first interlayer insulating film 190. The tap source/drain contact D_CA2 is placed on the tap source/drain region D_SDT. The tap source/drain contact D_CA2 is connected to the tap source/drain region D_SDT.

A second decap source/drain via D_VA2 may be placed inside the second interlayer insulating film 191. The second decap source/drain via D_VA2 may connect the tap source/drain contact D_CA2 to the second power supply line PWR2. The tap source/drain region D_SDT may be connected to the second power supply line PWR2.

In the integrated circuit according to some embodiments, the tap source/drain contact D_CA2 may include a first tap source/drain contact and a second tap source/drain contact spaced apart from each other in the second direction D2. As an example, the first tap source/drain contact and the second tap source/drain contact spaced apart from each other in the second direction D2 may be connected to each other by a conductive pattern which is not shown. As another example, the first tap source/drain contact and the second tap source/drain contact spaced apart from each other in the second direction D2 are not connected to each other. In such a case, only one of the first tap source/drain contact and the second tap source/drain contact may be connected to the second power supply line PWR2.

A decap gate contact D_CB may be placed inside the first decap gate capping pattern D_GCP1. The decap gate contact D_CB is placed on the first decap gate electrode D_GE1. The decap gate contact D_CB may be connected to the first decap gate electrode D_GE1. Although the decap source gate contact D_CB is shown as not being placed on a first outermost gate electrode placed in the outermost part of the first decap source gate electrode D_GE1, the embodiment is not limited thereto.

A decap gate via D_VB may be placed inside the second interlayer insulating film 191. The decap gate via D_VB may connect the first decap gate electrode D_GE1 to the second power supply line PWR2. The first decap gate electrode D_GE1 may be connected to the second power supply line PWR2.

The buffer source/drain region D_SDB is not electrically connected to the first power supply line PWR1 and the second power supply line PWR2. The buffer source/drain region D_SDB may be in a floating state.

Each of the decap source/drain contact D_CAL the tap source/drain contact D_CA2, the decap gate contact D_CB, the first decap source/drain via D_VA1, the second decap source/drain via D_VA2, and the decap gate via D_VB includes a conductive material.

Although FIG. 2 shows that a position at which the decap source/drain contact D_CA1 is separated into two parts differs from a position at which the tap source/drain contact D_CA2 is separated into two parts, the embodiment is not limited thereto.

Figure 4:
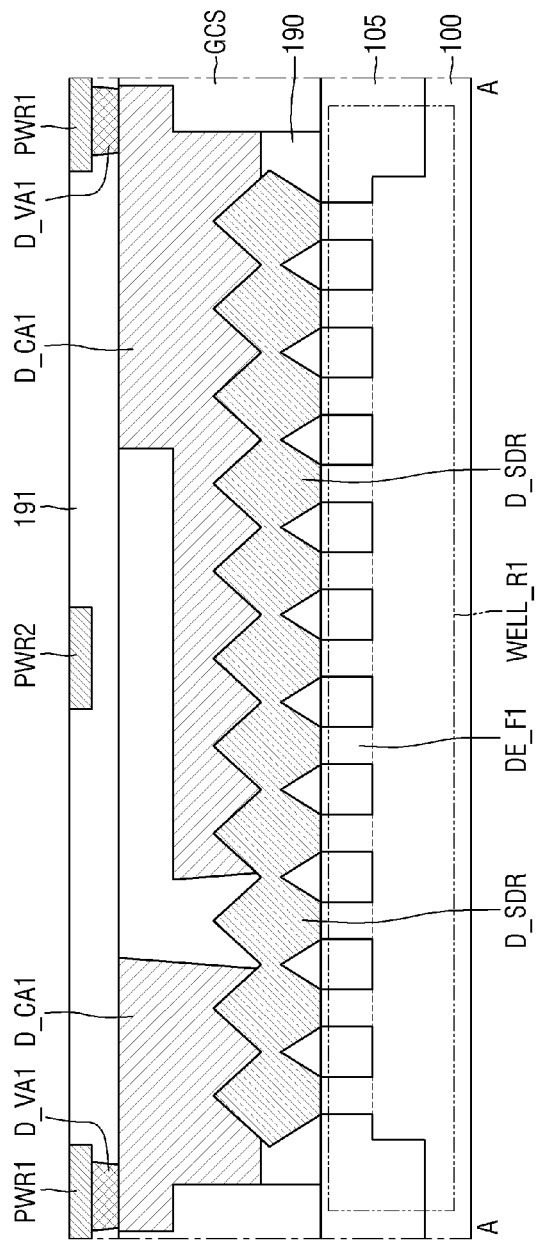
FIGS. 4, 5A, 5B, and 6 to 10 are exemplary cross-sectional views taken along A-A, B-B, C-C, D-D, E-E, F-F, and G-G of FIG. 2.

Although FIG. 4 shows that a part of the decap sources/drain contact D_CA1 perpendicularly overlaps the gate separation structure GCS, the embodiment is not limited thereto.

Further, although FIGS. 2 and 4 show that the upper surface of the decap source/drain contact D_CA1 is recessed near a position at which the decap gate contact D_CB is placed, the present disclosure is not limited thereto.

Figure 9:
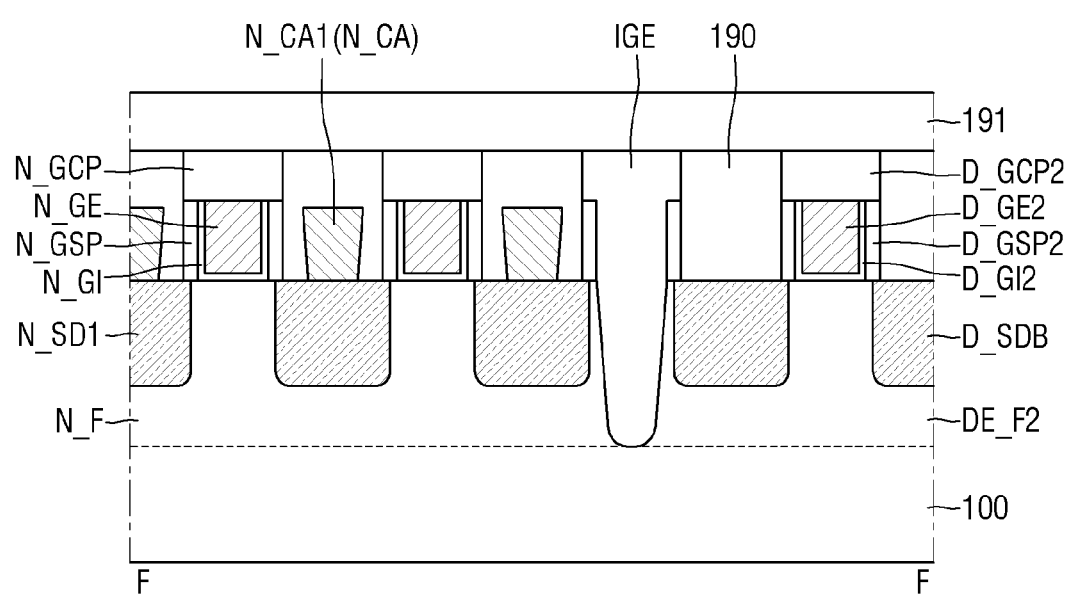
Figure 10:
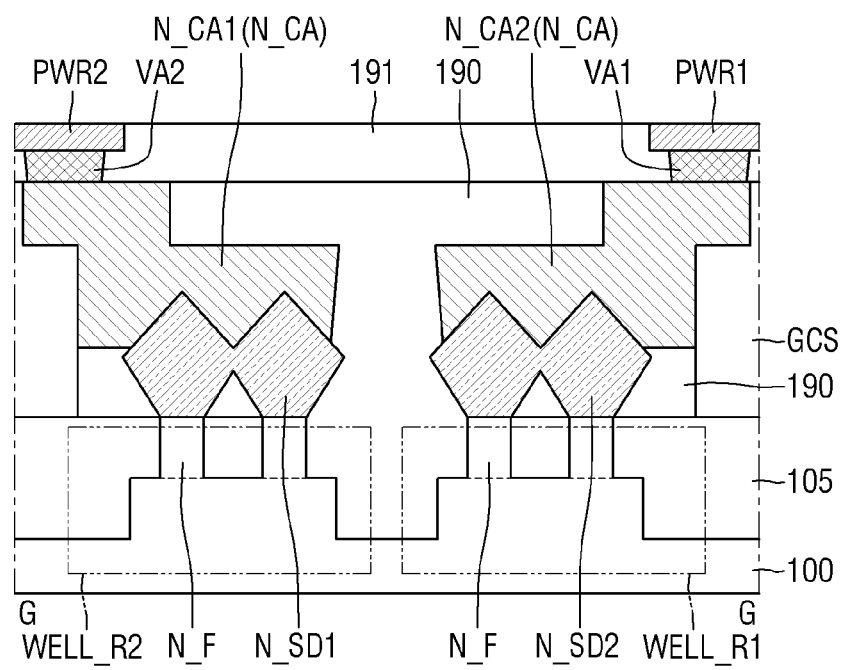
Figure 11:
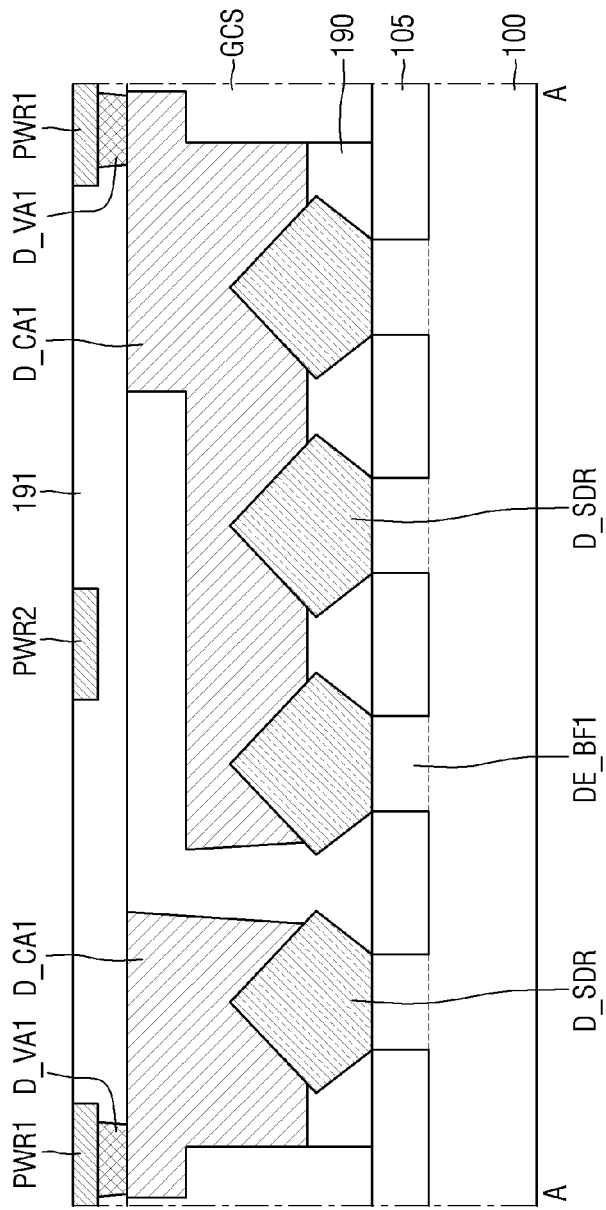
FIGS. 11, 12, 13A, 13B, and 14 are diagrams for explaining an integrated circuit according to some embodiments.
Figure 12:
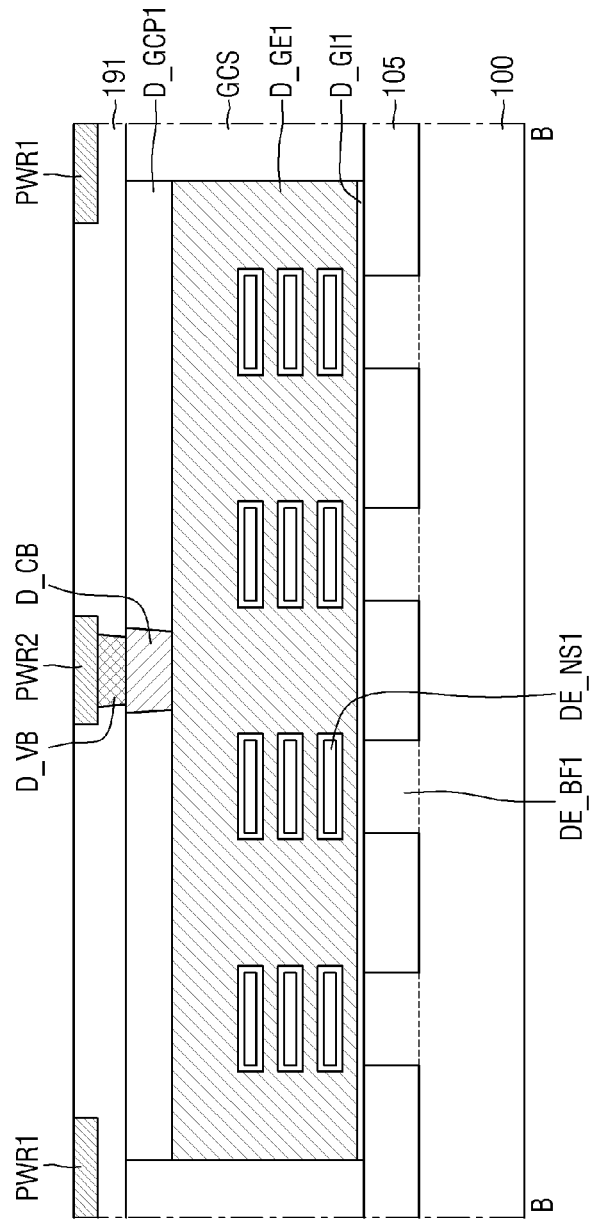

In FIGS. 2, 9 and 10, the normal cell N_CELL may include a plurality of normal fin type patterns N_F, a plurality of normal gate electrodes N_GE, a plurality of first normal source/drain regions N_SD1, a plurality of second normal source/drain regions N_SD2, and a plurality of normal source/drain contacts N_CA.

The normal fin type pattern N_F may protrude from the substrate 100. The normal pin type pattern N_F may extend long in the first direction D1. Adjacent normal fin type patterns N_F may be spaced apart from each other in the second direction D2. The normal fin type pattern N_F may be a multi-channel active pattern.

The normal fin type pattern N_F may be placed in the third active region AR3 and the fourth active region AR4. The third active region AR3 and the fourth active region AR4 may be separated by the deep trench. The third active region AR3 may be adjacent to the second power supply line PWR2. The fourth active region AR4 may be adjacent to the first power supply line PWR1.

Each of the plurality of normal gate electrodes N_GE may extend in the second direction D2. The plurality of normal gate electrodes N_GE may be placed on the field insulating film 105. Each normal gate electrode N_GE may intersect the normal fin type pattern N_F.

Each normal gate electrode N_GE may be formed over the third active region AR3 and the fourth active region AR4. Unlike that shown, a part of the plurality of normal gate electrodes N_GE may be separated into two a first portion and a second portion. For example, the first portion of the normal gate electrode N_GE intersects the normal fin type pattern N_F placed in the third active region AR3, but may not intersect the normal fin type pattern N_F placed in the fourth active region AR4. The normal gate electrode N_GE includes a conductive material.

An insulating gate IGE extends in the second direction D2 along the boundary between the decoupling filler cell DECAP CELL and the normal cell N_CELL. The insulating gate IGE may be placed at the boundary of the decoupling filler cell DECAP CELL extending in the second direction D2. The insulating gate IGE may be placed at the boundary of the normal cell N_CELL that extends in the second direction D2. The normal fin type pattern N_F and the second decap fin type pattern DE_F2 may be separated by the insulating gate IGE. The insulating gate IGE may include an insulating material.

The gate separation structure GCS may be placed along the boundary of the normal cell N_CELL extending in the first direction D1. The normal gate electrode N_GE may be placed between the gate separation structures GCS adjacent to each other in the second direction D2.

The normal gate spacer N_GSP may be placed on the side walls of the normal gate electrode N_GE. The normal gate spacer N_GSP includes an insulating material.

A spacer pattern may be placed on a part of the side walls of the insulating gate IGE. The spacer pattern includes the same material as the normal gate spacer N_GSP.

The normal gate insulating film N_GI may extend along the side walls and the bottom surface of the normal gate electrode N_GE. Although it is not shown, the normal gate insulating film N_GI may extend along a profile of the normal fin type pattern N_F protruding upward from the field insulating film 105 and the upper surface of the field insulating film 105. The normal gate insulating film N_GI may include an insulating material. As an example, the normal gate insulating film N_GI may include a paraelectric material film having the paraelectric property. As another example, the normal gate insulating film N_GI may include a ferroelectric material film having the ferroelectric property, and a paraelectric material film having the paraelectric property.

The normal gate capping pattern N_GCP may be placed on the upper surface of the normal gate electrode N_GE. Each normal gate capping pattern N_GCP includes an insulating material.

The first normal source/drain region N_SD1 may be placed in the third active region AR3. A plurality of first normal source/drain regions N_SD1 are placed on the third active region AR3. The first normal source/drain region N_SD1 may be placed on the normal fin type pattern N_F of the third active region AR3. The first normal source/drain region N_SD1 may include a semiconductor epitaxial pattern.

The third active region AR3 may include a second well region WELL_R2 of the second conductive type. The second well region WELL_R2 of the second conductive type of the third active region AR3 may include the normal fin type pattern N_F including impurities of the second conductive type and a part of the substrate 100. The first normal source/drain region N_SD1 may have the first conductive type. The first normal source/drain region N_SD1 of the first conductive type may be formed on the second well region WELL_R2 of the second conductive type.

The second normal source/drain region N_SD2 may be placed in the fourth active region AR4. A plurality of second normal source/drain regions N_SD2 are placed on the fourth active region AR4. The second normal source/drain region N_SD2 may be placed on the normal fin type pattern N_F of the fourth active region AR4. The second normal source/drain region N_SD2 may include a semiconductor epitaxial pattern.

The fourth active region AR4 may include a first well region WELL_R1 of the first conductive type. The first well region WELL_R1 of the first conductive type of the fourth active region AR4 may include the normal fin type pattern N_F including impurities of the first conductive type and a part of the substrate 100. The second normal source/drain region N_SD2 may have the second conductive type. The second normal source/drain region N_SD2 of the second conductive type may be formed on the first well region WELL_R1 of the first conductive type.

For example, the first well region WELL_R1 of the first conductive type may be an n-type well region, and the second well region WELL_R2 of the second conductive type may be a p-type well region. In such a case, the first normal source/drain region N_SD1 of the first conductive type may be an n-type first normal source/drain region and the second normal source/drain region N_SD2 of the second conductive type may be a p-type second normal source/drain region. In the third active region AR3, the first normal transistor including the normal gate electrode N_GE and the n-type first normal source/drain region N_SD1 is an n-type transistor. In the fourth active region AR4, the second normal transistor including the normal gate electrode N_GE and the p-type second normal source/drain region N_SD2 is a p-type transistor. The first normal transistor and the second normal transistor are included in the normal cell N_CELL. At this time, the first power supply line PWR1 may be connected to the power voltage Vdd and the second power supply line PWR2 may be connected to the ground voltage Vss.

For example, the first well region WELL_R1 of the first conductive type may be a p-type well region and the second well region WELL_R2 of the second conductive type may be an n-type well region. In such a case, the first normal source/drain region N_SD1 of the first conductive type may be a p-type first normal source/drain region and the second normal source/drain region N_SD2 of the second conductive type may be an n-type second normal source/drain region. In the third active region AR3, the first normal transistor including the normal gate electrode N_GE and the p-type first normal source/drain region N_SD1 are a p-type transistor. In the fourth active region AR4, the second normal transistor including the normal gate electrode N_GE and the n-type second normal source/drain region N_SD2 are an n-type transistor. At this time, the first power supply line PWR1 may be connected to the ground voltage Vss and the second power supply line PWR2 may be connected to the power voltage Vdd.

The normal source/drain contact N_CA may be placed in the first interlayer insulating film 190. The normal source/drain contact N_CA may include a first normal source/drain contact N_CA1 and a second normal source/drain contact N_CA2.

The first normal source/drain contact N_CA1 is placed on the first normal source/drain region N_SD1. The first normal source/drain contact N_CA1 is connected to the first normal source/drain region N_SD1.

The second normal source/drain contact N_CA2 is placed on the second normal source/drain region N_SD2. The second normal source/drain contact N_CA2 is connected to the second normal source/drain region N_SD2.

Each of a first normal source/drain via VA1 and a second normal source/drain via VA2 may be placed inside the second interlayer insulating film 191. The first normal source/drain via VA1 may connect the second normal source/drain contact N_CA2 to the first power supply line PWR1. The second normal source/drain via VA2 may connect the first normal source/drain contact N_CA1 and the second power supply line PWR2.

The first normal source/drain region N_SD1 may be connected to the second power supply line PWR2. At least one or more of the plurality of first normal source/drain regions N_SD1 may be connected to the second power supply line PWR2. The second normal source/drain region N_SD2 may be connected to the first power supply line PWR1. At least one or more of the plurality of second normal source/drain regions N_SD2 may be connected to the first power supply line PWR1.

Each of the first normal source/drain contact N_CA1, the second normal source/drain contact N_CA2, the first normal source/drain via VA1, and the second normal source/drain via VA2 includes a conductive material.

Although FIG. 2 shows that each first normal source/drain contact N_CA1 is spaced apart from each second normal source/drain contact N_CA2 in the second direction D2, the embodiment is not limited thereto. At least one of the first normal source/drain contacts N_CA1 may be directly connected to the corresponding second normal source/drain contact N_CA2.

Although FIG. 10 shows that a part of the first normal source/drain contact N_CA1 and a part of the second normal source/drain contact N_CA2 perpendicularly overlap the gate separation structure GCS, the embodiment is not limited thereto.

Although FIGS. 9 and 10 show that a part of the first normal source/drain contact N_CA1 and a part of the second normal source/drain contact N_CA2 are recessed, the embodiment is not limited thereto.

FIGS. 11 to 14 are diagrams for explaining an integrated circuit according to some embodiments. For convenience of explanation, points different from those described referring to FIGS. 2 to 10 will be mainly described. For reference, FIGS. 11 to 14 are exemplary cross-sectional views taken along A-A, B-B, C-C and G-G of FIG. 2.

Referring to FIGS. 2 and 11 to 14, the decoupling filler cell DECAP CELL may include a plurality of first decap lower patterns DE_BF1, a plurality of second decap lower patterns DE_BF2, a plurality of first decap sheet patterns DE_NS1, a plurality of second decap sheet patterns DE_NS2, a plurality of decap gate electrodes D_GE1 and D_GE2, a plurality of decap source/drain regions D_SDR, a plurality of tap source/drain regions D_SDT, a plurality of decap source/drain contacts D_CAL a plurality of tap source/drain contacts D_CA2, and a plurality of decap gate contacts D_CB.

Although it is not shown, the decoupling filler cell DECAP CELL includes a plurality of buffer source/drain regions D_SDB.

The first decap lower pattern DE_BF1 may protrude from the substrate 100. The first decap lower pattern DE_BF1 may extend long in the first direction D1. Adjacent first decap lower patterns DE_BF1 may be spaced apart from each other in the second direction D2.

The plurality of first decap sheet patterns DE_NS1 may be placed on a first decap lower pattern DE_BF1. The plurality of first decap sheet patterns DE_NS1 may be vertically spaced apart from a first decap lower pattern DE_BF1. Although the three first decap sheet patterns DE_NS1 are shown, the number thereof is not limited thereto.

The description of a second decap lower pattern DE_BF2 and second decap sheet pattern DE_NS2 may be substantially the same as the description of the first decap lower pattern DE_BF1 and a first decap sheet pattern DE_NS1.

The first decap lower pattern DE_BF1 and the first decap sheet pattern DE_NS1 may be placed in the decoupling capacitor region DECAP_R. The second decap lower pattern DE_BF2 and the second decap sheet pattern DE_NS2 may be placed in the decoupling buffer region DECAP_B and the decoupling tap region DECAP_T.

The first decap lower pattern DE_BF1 and the first decap sheet pattern DE_NS1 may be multi-channel active patterns. The second decap lower pattern DE_BF2 and the second decap sheet pattern DE_NS2 may be multi-channel active patterns. Each of the first decap lower pattern DE_BF1, the second decap lower pattern DE_BF2, the first decap sheet pattern DE_NS1, and the second decap sheet pattern DE_NS2 may include elemental semiconductor materials or compound semiconductor materials.

The following explanation will focus on the first decap lower pattern DE_BF1 and the first decap sheet pattern DE_NS1.

The field insulating film 105 may cover the side walls of the first decap lower pattern DE_BF1. The field insulating film 105 is not formed on the upper surface of the first decap lower pattern DE_BF1.

The first decap gate electrode D_GE1 may be formed on the first decap lower pattern DE_BF1. The first decap gate electrode D_GE1 may intersect the first decap lower pattern DE_BF1. The first decap gate electrode D_GE1 may wrap the first decap sheet pattern DE_NS1.

The first decap gate insulating film D_GI1 may extend along the upper surface of the field insulating film 105 and the upper surface of the first decap lower pattern DE_BF1. The first decap gate insulating film D_GI1 may wrap the first decap sheet pattern DE_NS1.

Explanation of the second decap gate electrode D_GE2 and the second decap gate insulating film D_GI2 may be similar to the explanation of the first decap gate electrode D_GE1 and the first decap gate insulating film D_GI1.

Figure 13A:
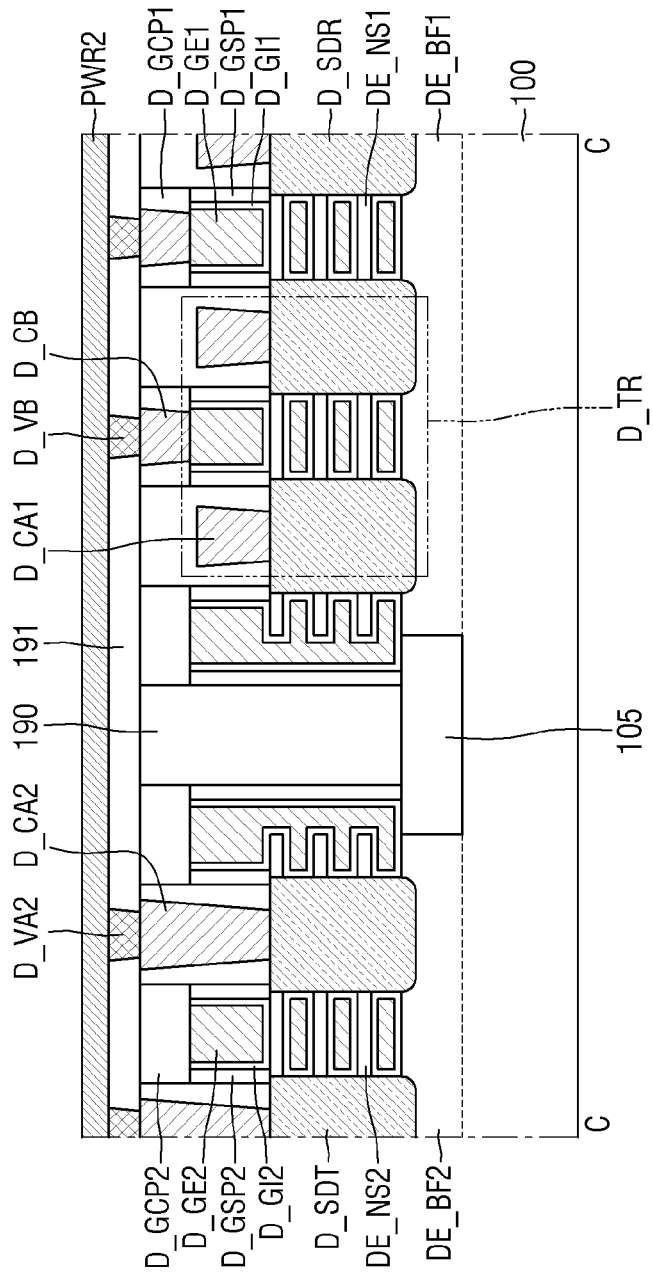

In FIG. 13A, the first decap gate spacer D_GSP1 is not placed between the first decap lower pattern DE_BF1 and the first decap sheet pattern DE_NS1 and between the adjacent first decap sheet patterns DE_NS1. The second decap gate spacer D_GSP2 is not placed between the second decap lower pattern DE_BF2 and the second decap sheet pattern DE_NS2 and between the adjacent second decap sheet patterns DE_NS2.

Figure 13B:
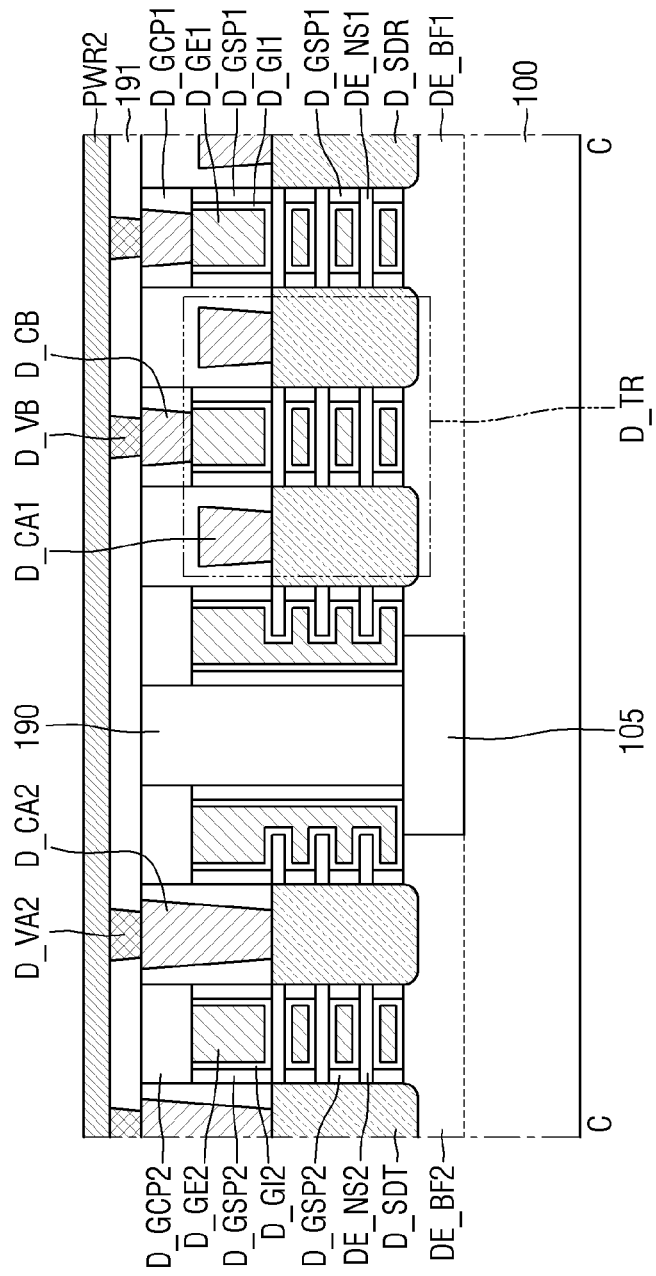

In FIG. 13B, the first decap gate spacer D_GSP1 may be placed between the first decap lower pattern DE_BF1 and the first decap sheet pattern DE_NS1 and between the adjacent first decap sheet patterns DE_NS1. The second decap gate spacer D_GSP2 may be placed between the second decap lower pattern DE_BF2 and the second decap sheet pattern DE_NS2 and between the adjacent second decap sheet patterns DE_NS2.

The decap source/drain region D_SDR may be formed on the first decap lower pattern DE_BF1. The decap source/drain region D_SDR is connected to the first decap sheet pattern DE_NS1.

The decoupling capacitor region DECAP_R may include a first well region (WELL_R1 of FIG. 4) of the first conductive type. The first well region WELL_R1 of the first conductive type may include the first decap lower pattern DE_BF1 including impurities of the first conductive type and a part of the substrate 100.

The tap source/drain region D_SDT may be formed on the second decap lower pattern DE_BF2. The tap source/drain region D_SDT is connected to the second decap sheet pattern DE_NS2.

The decoupling tap region DECAP_T may include a second well region (WELL_R2 of FIG. 7) of the second conductive type. The second well region WELL_R2 of the second conductive type may include a second decap lower pattern DE_BF2 including impurities of the second conductive type and a part of the substrate 100.

Figure 14:
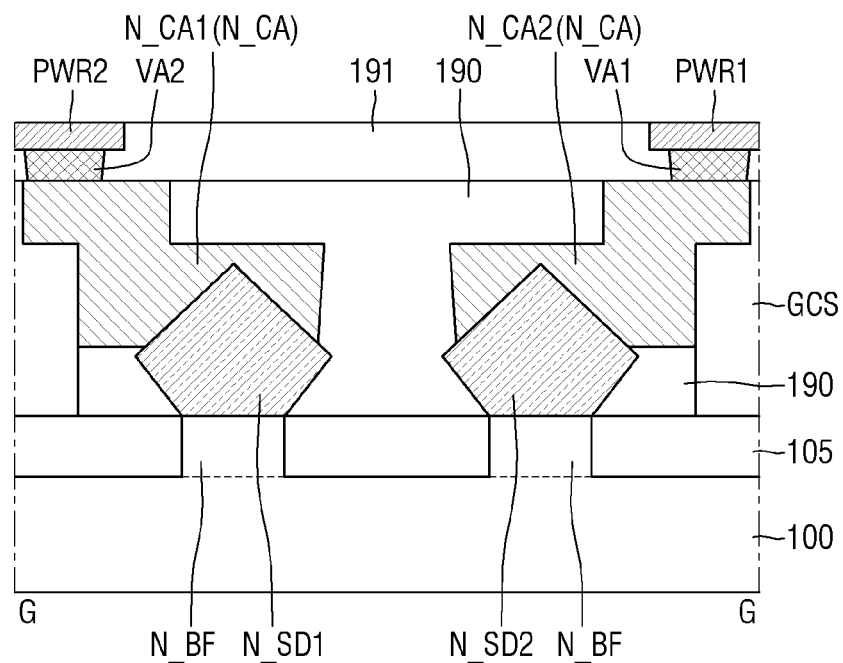

In FIGS. 2 and 14, the normal cell N_CELL may include a plurality of normal lower patterns N_BF, a plurality of normal gate electrodes N_GE, a plurality of first normal source/drain regions N_SD1, a plurality of second normal source/drain regions N_SD2, and a plurality of normal source/drain contacts N_CA.

The normal lower pattern N_BF may protrude from the substrate 100. The normal lower pattern N_BF may extend long in the first direction DE Adjacent normal lower patterns N_BF may be spaced apart from each other in the second direction D2. Although the single normal lower pattern N_BF may be placed in each of the third active region AR3 and the fourth active region AR4, the embodiment is not limited thereto.

Although it is not shown, a plurality of normal sheet patterns is placed on the normal lower pattern N_BF. The normal lower pattern N_BF and the normal sheet pattern may be multi-channel active patterns.

The first normal source/drain region N_SD1 is placed on the normal lower pattern N_BF of the third active region AR3. The second normal source/drain region N_SD2 is placed on the normal lower pattern N_BF of the fourth active region AR4.

The second well region (WELL_R2 of FIG. 10) of the second conductive type of the third active region AR3 may include a normal lower pattern N_BF including impurities of the second conductive type and a part of the substrate 100. The first well region (WELL_R1 of FIG. 10) of the first conductive type of the fourth active region AR4 may include the normal lower pattern N_BF including impurities of the first conductive type and a part of the substrate 100.

Although the drawings of the integrated circuit described above show a fin-type transistor (FinFET) including a channel region of a fin-type pattern shape, a transistor including a nanowire or a nanosheet, and a MBCFET™ (Multi-Bridge Channel Field Effect Transistor) as an example, the embodiments are not limited thereto. The matters of the aforementioned decoupling filler cell DECAP CELL may, of course, be applied to an integrated circuit including a planar transistor. In addition, the technical idea of the present disclosure may be applied to a transistor based on two-dimensional material (2D material-based FETs) and a heterostructure thereof.

The integrated circuits according to some embodiments may include a tunneling transistor (tunneling FET) or a three-dimensional (3D) transistor. Further, the integrated circuits according to some embodiments may include a bipolar junction transistor, a laterally diffused metal oxide semiconductor (LDMOS), or the like.

Figure 15:
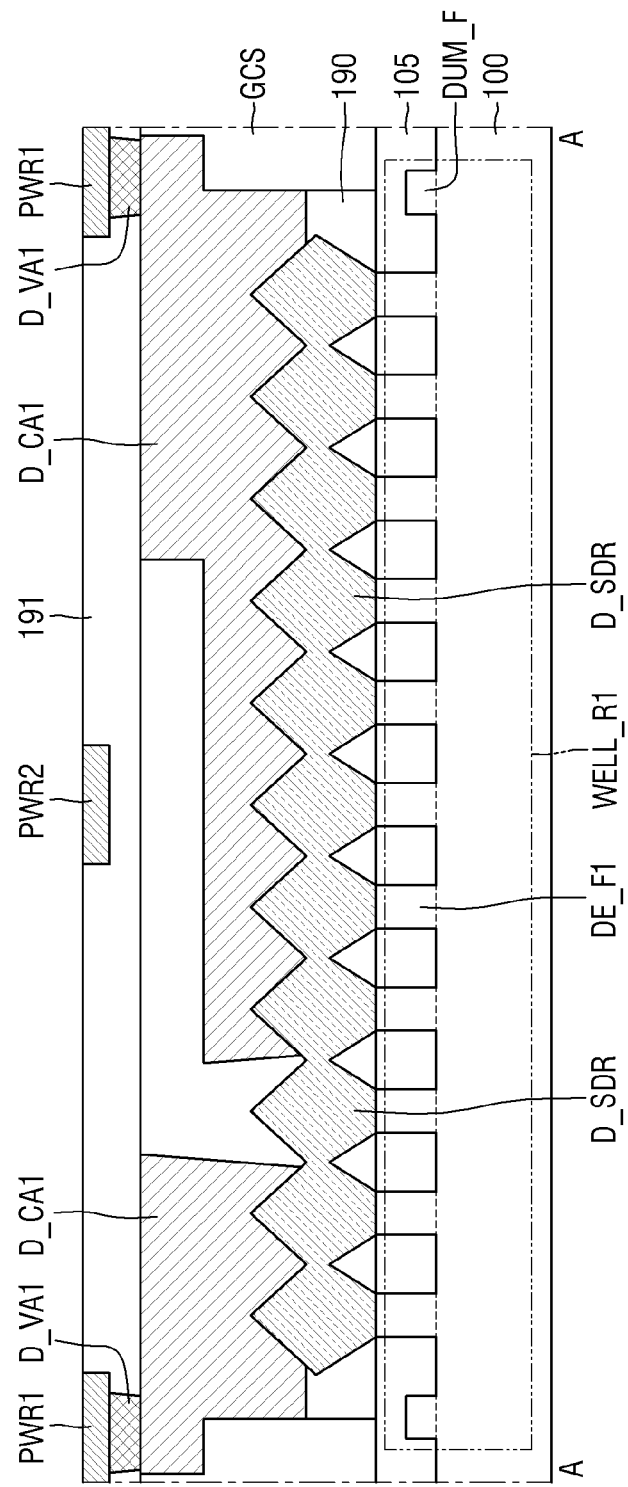
FIGS. 15 and 16 are diagrams for explaining an integrated circuit according to some embodiments.
Figure 16:
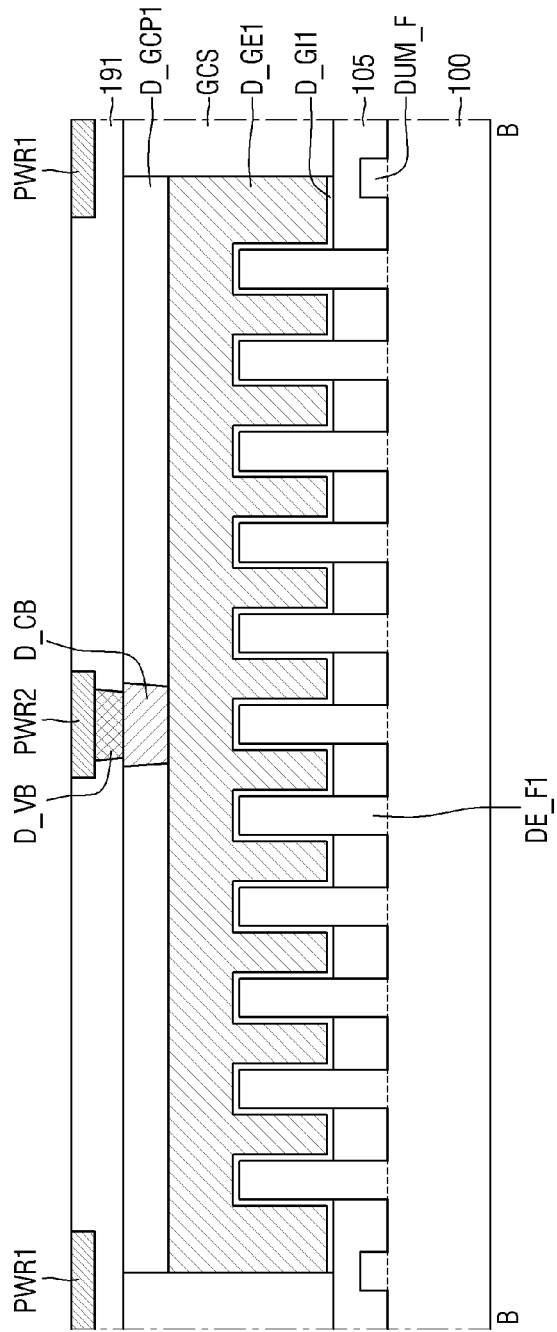

FIGS. 15 and 16 are diagrams for explaining an integrated circuit according to some embodiments. For convenience of explanation, points different from those described referring to FIGS. 2 to 10 will be mainly described. For reference, FIGS. 15 and 16 are exemplary cross-sectional views taken along A-A and B-B of FIG. 2.

Referring to FIGS. 2, 15 and 16, in the integrated circuit according to some embodiments, a dummy fin type pattern DUM_F may be placed along a boundary of the decoupling filler cell DECAP CELL extending in the first direction D1.

The field insulating film 105 covers the upper surface of the dummy fin type pattern DUM_F. The dummy fin type pattern DUM_F does not protrude upward from the upper surface of the field insulating film 105.

The gate separation structure GCS may be placed on the dummy fin type pattern DUM_F.

Although it is not shown, the dummy fin type pattern DUM_F may be placed along the boundary of the normal cell N_CELL extending in the first direction D1.

Figure 17:
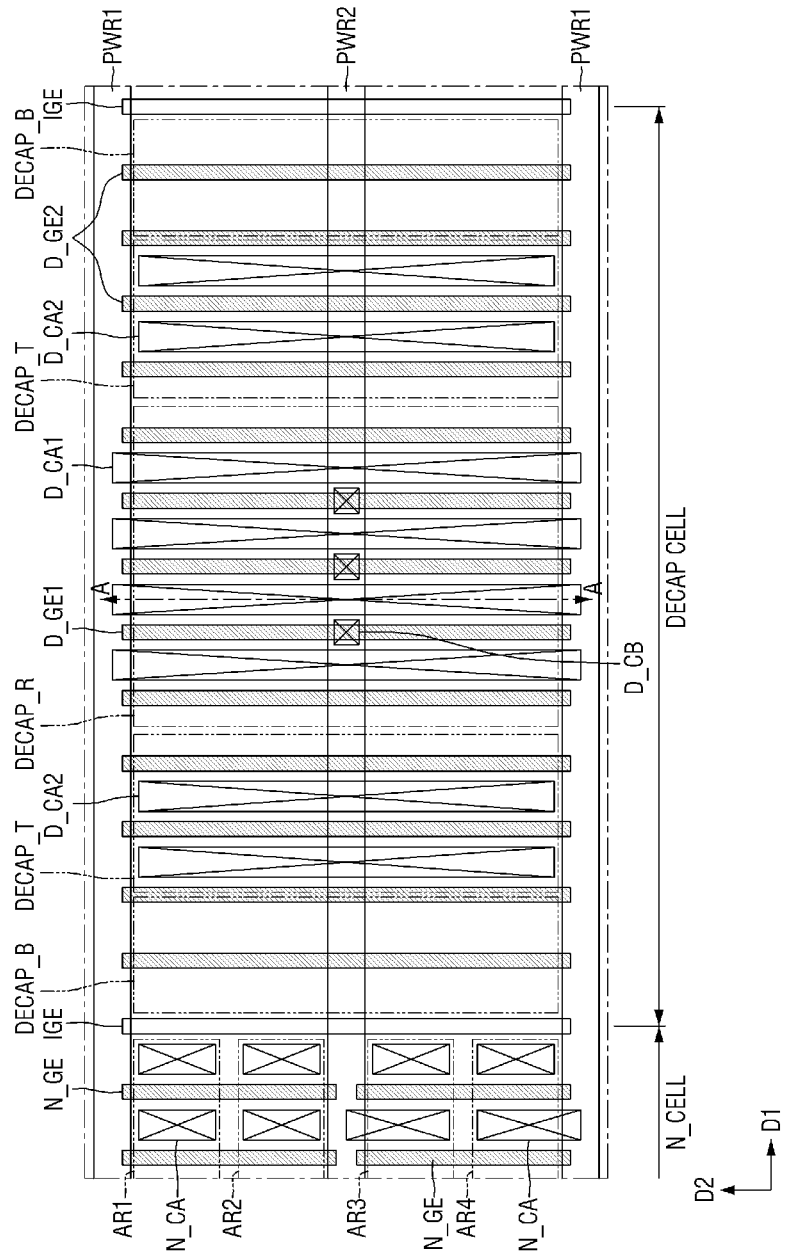
FIGS. 17 and 18 are diagrams for explaining an integrated circuit according to some embodiments.
Figure 18:
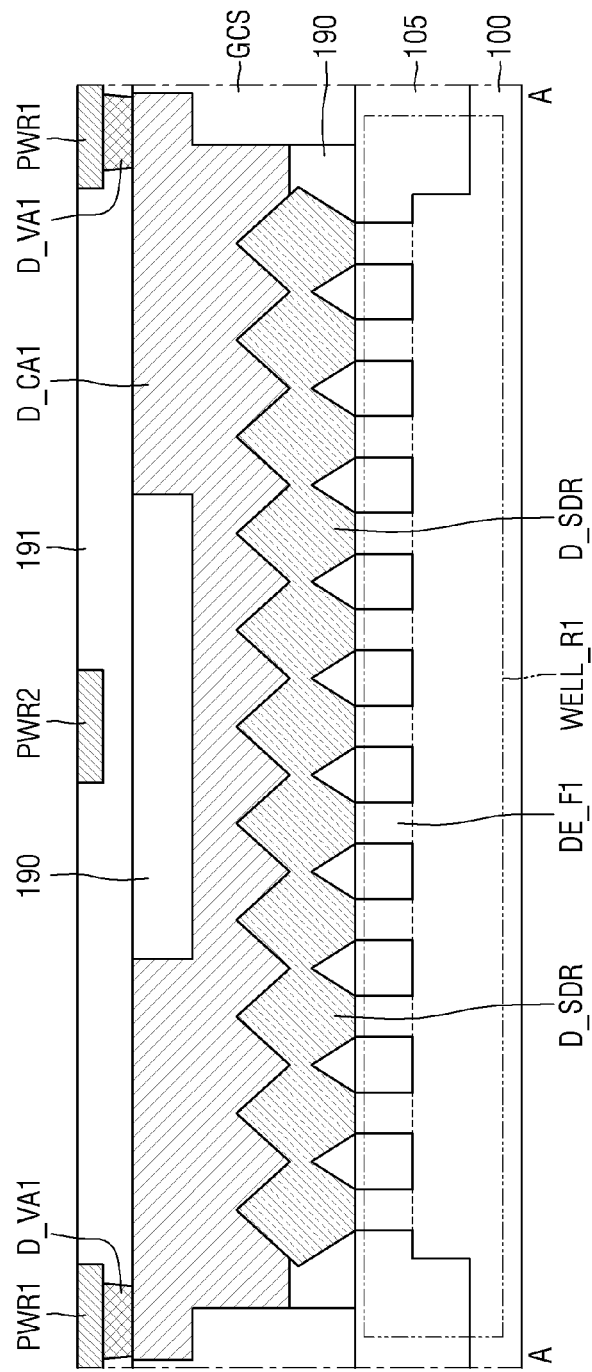

FIGS. 17 and 18 are diagrams for explaining an integrated circuit according to some embodiments. For convenience of explanation, points different from those described referring to FIGS. 2 to 10 will be mainly described. For reference, FIG. 17 is an exemplary layout diagram in which a portion P of FIG. 1 is enlarged. FIG. 18 is an exemplary cross-sectional view taken along A-A of FIG. 17.

Referring to FIGS. 17 and 18, in the integrated circuit according to some embodiments, a single decap source/drain contact D_CA1 may be placed between first power supply lines PWR1 adjacent to each other in the second direction D2.

For example, the first power supply line PWR1 may include a first_1 power supply line and a first_2 power supply line spaced apart from each other in the second direction D2. The decap source/drain contact D_CA1 may extend from the first_1 power supply line to the first_2 power supply line.

Although the tap source/drain contact D_CA2 may also extend from the first_1 power supply line to the first_2 power supply line, the embodiment is not limited thereto.

Figure 19:
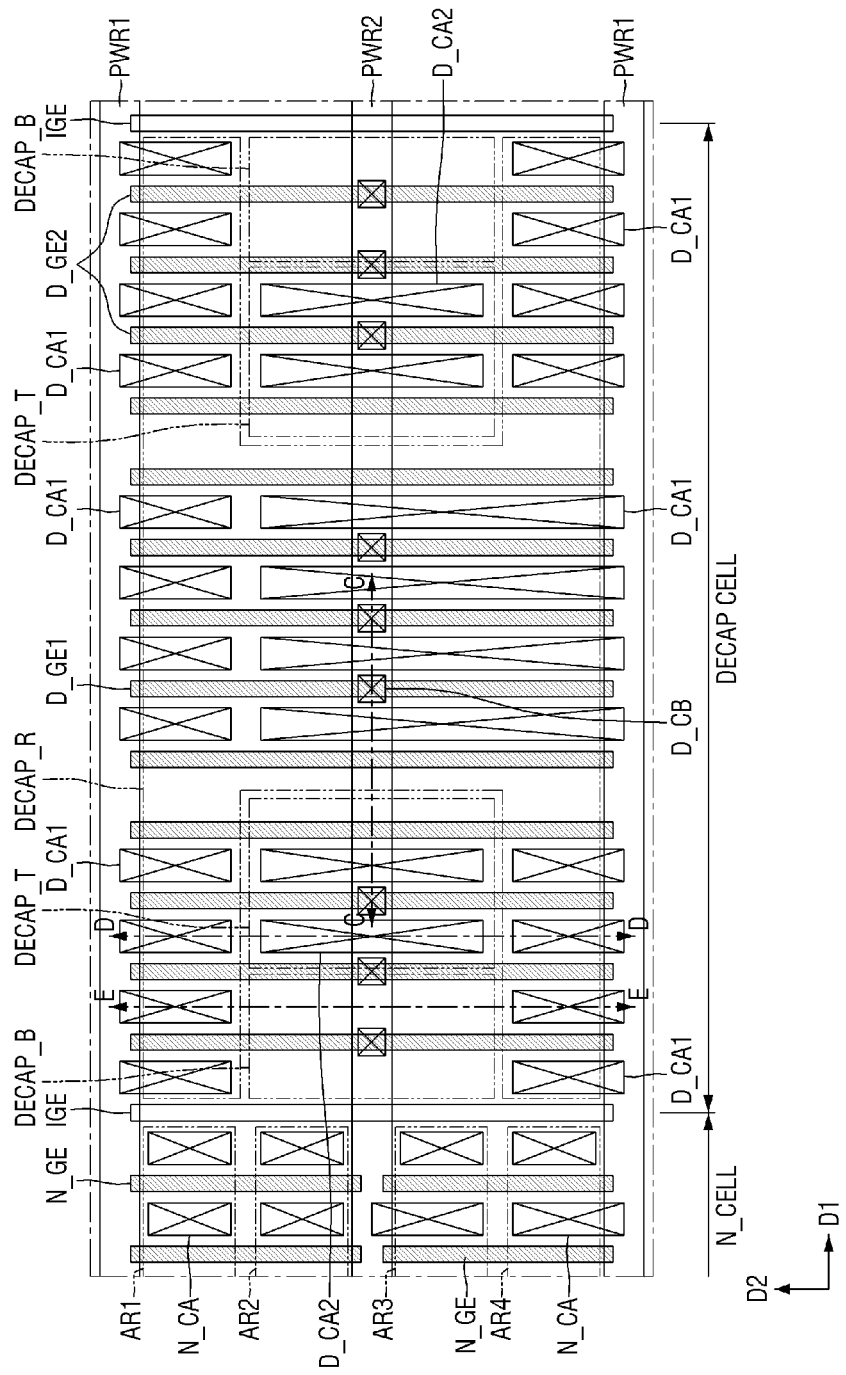
FIGS. 19 to 23 are diagrams for explaining an integrated circuit according to some embodiments.
Figure 20:
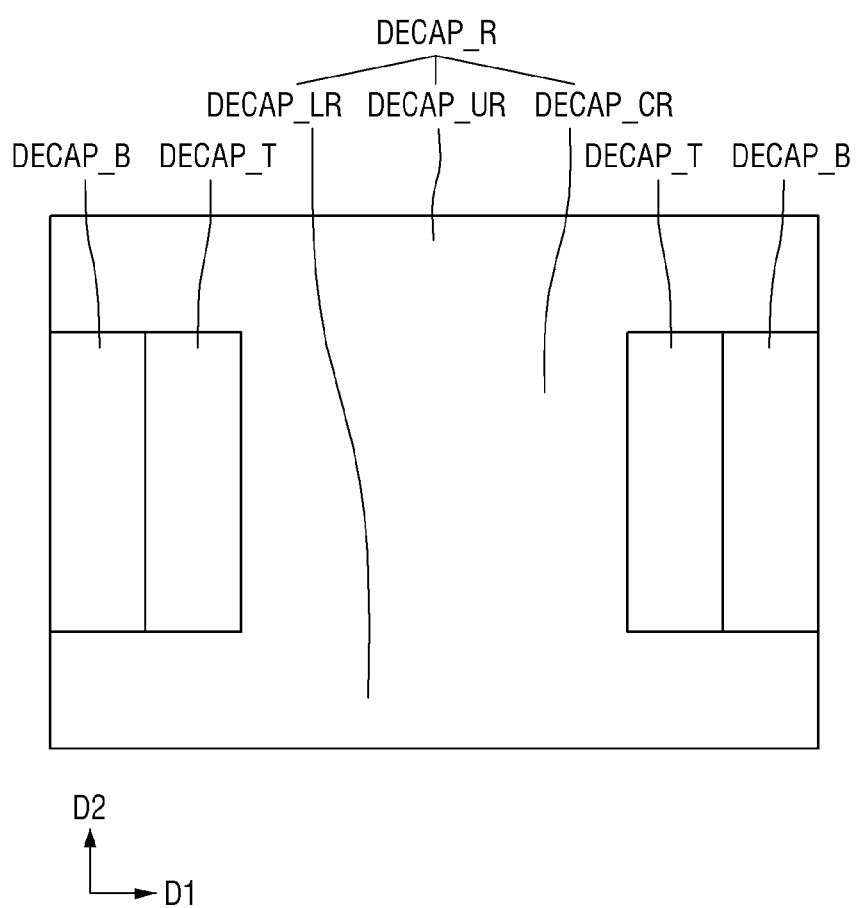
Figure 21:
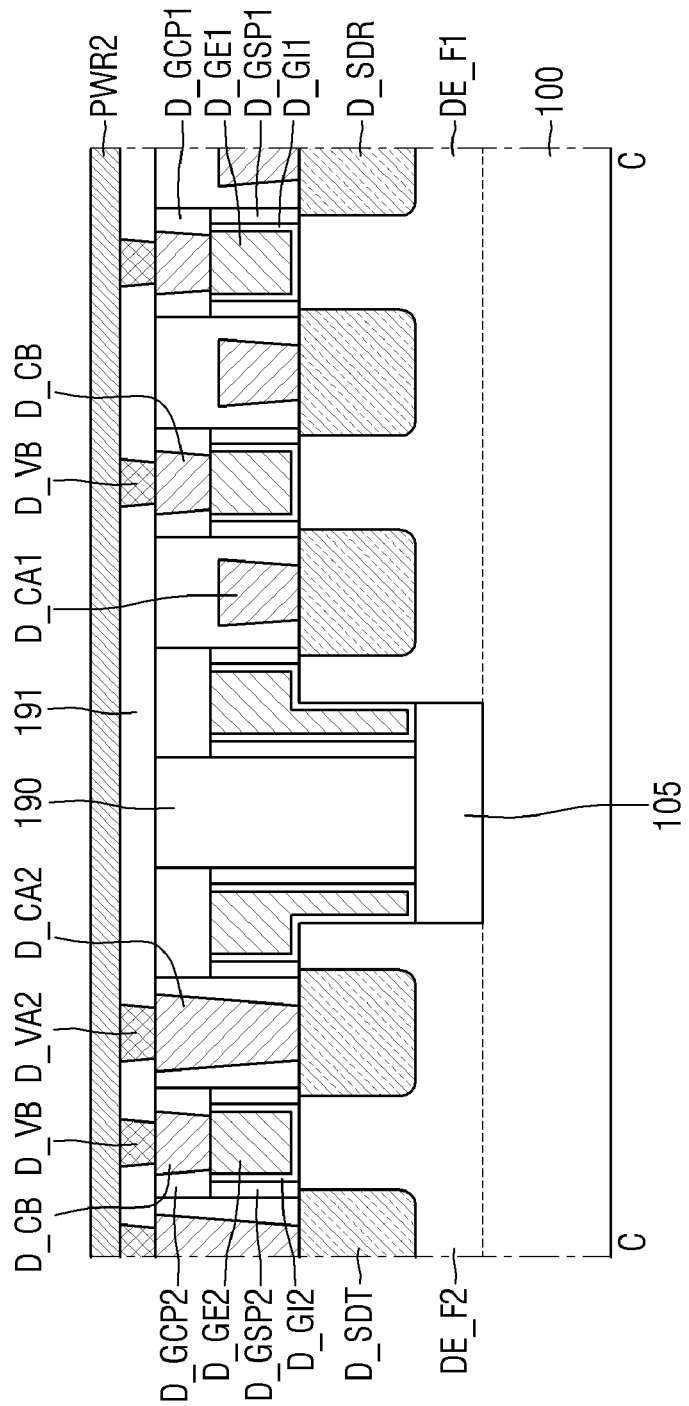
Figure 22:
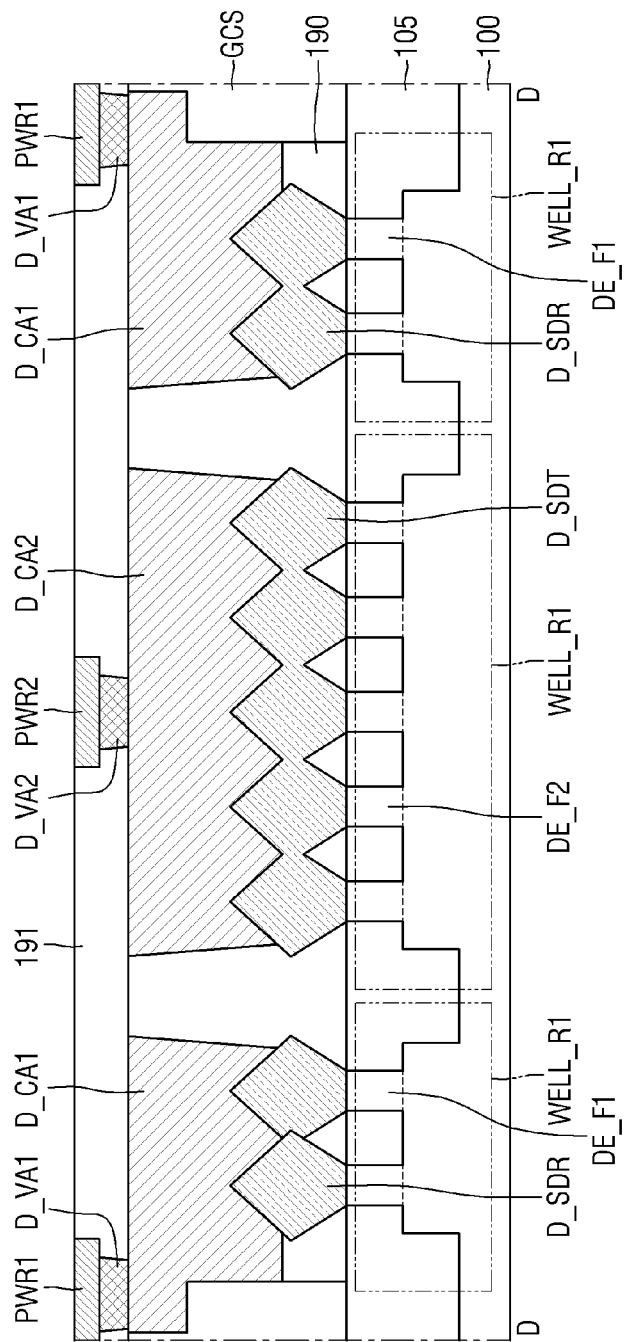
Figure 23:
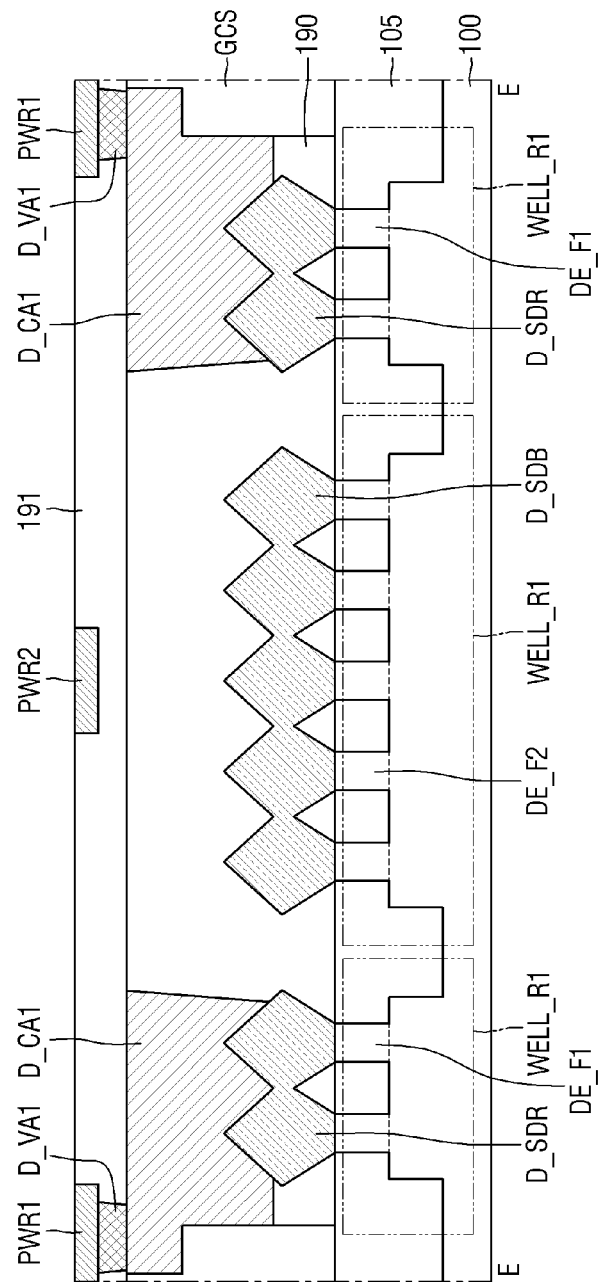

FIGS. 19 to 23 are diagrams for explaining an integrated circuit according to some embodiments. For convenience of explanation, points different from those described referring to FIGS. 2 to 10 will be mainly described. For reference, FIG. 19 is an exemplary layout diagram in which a portion P of FIG. 1 is enlarged. FIG. 20 is a diagram for explaining the shape of the decoupling filler cell of FIG. 19. FIGS. 21 to 23 are exemplary cross-sectional views taken along C-C, D-D and E-E of FIG. 19.

Referring to FIGS. 19 to 23, in the integrated circuit according to some embodiments, the decoupling filler cell DECAP CELL may include a decoupling capacitor region DECAP_R in the form of a 90-degree rotation of "H".

The decoupling capacitor region DECAP_R includes an upper capacitor region DECAP_UR, a lower capacitor region DECAP_LR, and a connecting capacitor region DECAP_CR.

Each of the upper capacitor region DECAP_UR and the lower capacitor region DECAP_LR may be a capacitor region which extends long in the first direction D1. The upper capacitor region DECAP_UR may be spaced apart from the lower capacitor region DECAP_LR in the second direction D2. The connecting capacitor region DECAP_CR connects the upper capacitor region DECAP_UR and the lower capacitor region DECAP_LR.

Each of a width of the upper capacitor region DECAP_UR in the first direction D1 and a width of the lower capacitor region DECAP_LR in the first direction D1 is greater than a width of the connecting capacitor region DECAP_CR in the first direction D1.

The second power supply line PWR2 may pass through the connecting capacitor region DECAP_CR of the decoupling capacitor region DECAP_R. The second power supply line PWR2 does not pass through the upper capacitor region DECAP_UR and the lower capacitor region DECAP_LR.

The boundary of the decoupling filler cell DECAP CELL extending in the second direction D2 may be defined by the decoupling buffer region DECAP_B and the decoupling capacitor region DECAP_R. That is, the normal cell N_CELL may form a boundary with the decoupling buffer region DECAP_B and the decoupling capacitor region DECAP_R of the decoupling filler cell DECAP CELL in the first direction D1.

The decoupling buffer region DECAP_B and the decoupling tap region DECAP_T may be defined and placed between the upper capacitor region DECAP_UR and the lower capacitor region DECAP_LR. A cell height of the decoupling filler cell DECAP CELL is the same as a height of the decoupling capacitor region DECAP_R. However, the heights of the decoupling buffer region DECAP_B and the decoupling tap region DECAP_T are smaller than the cell height of the decoupling filler cell DECAP CELL.

In the integrated circuit according to some embodiments, the first decap gate electrode D_GE1 is placed in the decoupling capacitor region DECAP_R, but not placed in the decoupling buffer region DECAP_B and the decoupling tap region DECAP_T. The second decap gate electrode D_GE2 may be placed in the decoupling capacitor region DECAP_R, the decoupling buffer region DECAP_B, and the decoupling tap region DECAP_T.

The decap source/drain region D_SDR placed in the upper capacitor region DECAP_UR and the lower capacitor region DECAP_LR may be spaced apart from the tap source/drain region D_SDT in the second direction D2. The decap source/drain region D_SDR placed in the upper capacitor region DECAP_UR and the lower capacitor region DECAP_LR may be spaced apart from the buffer source/drain region D_SDB in the second direction D2.

The decap gate contact D_CB may be placed inside the first decap gate capping pattern D_GCP1 and the second decap gate capping pattern D_GCP2. The decap gate contact D_CB is placed on the first decap gate electrode D_GE1 and the second decap gate electrode D_GE2. The decap gate contact D_CB may be connected to the first decap gate electrode D_GE1 and the second decap gate electrode D_GE2. Although the decap gate contact D_CB is shown as not being placed on the first outermost gate electrode placed in the outermost part of the first decap gate electrode D_GE1, the embodiment is not limited thereto. Further, although the decap gate contact D_CB is shown as not being placed on the second outermost gate electrode placed in the outermost part of the second decap gate electrode D_GE2, the embodiment is not limited thereto.

The decap gate via D_VB may connect the second decap gate electrode D_GE2 to the second power supply line PWR2. The second decap gate electrode D_GE2 may be connected to the second power supply line PWR2.

Figure 24:
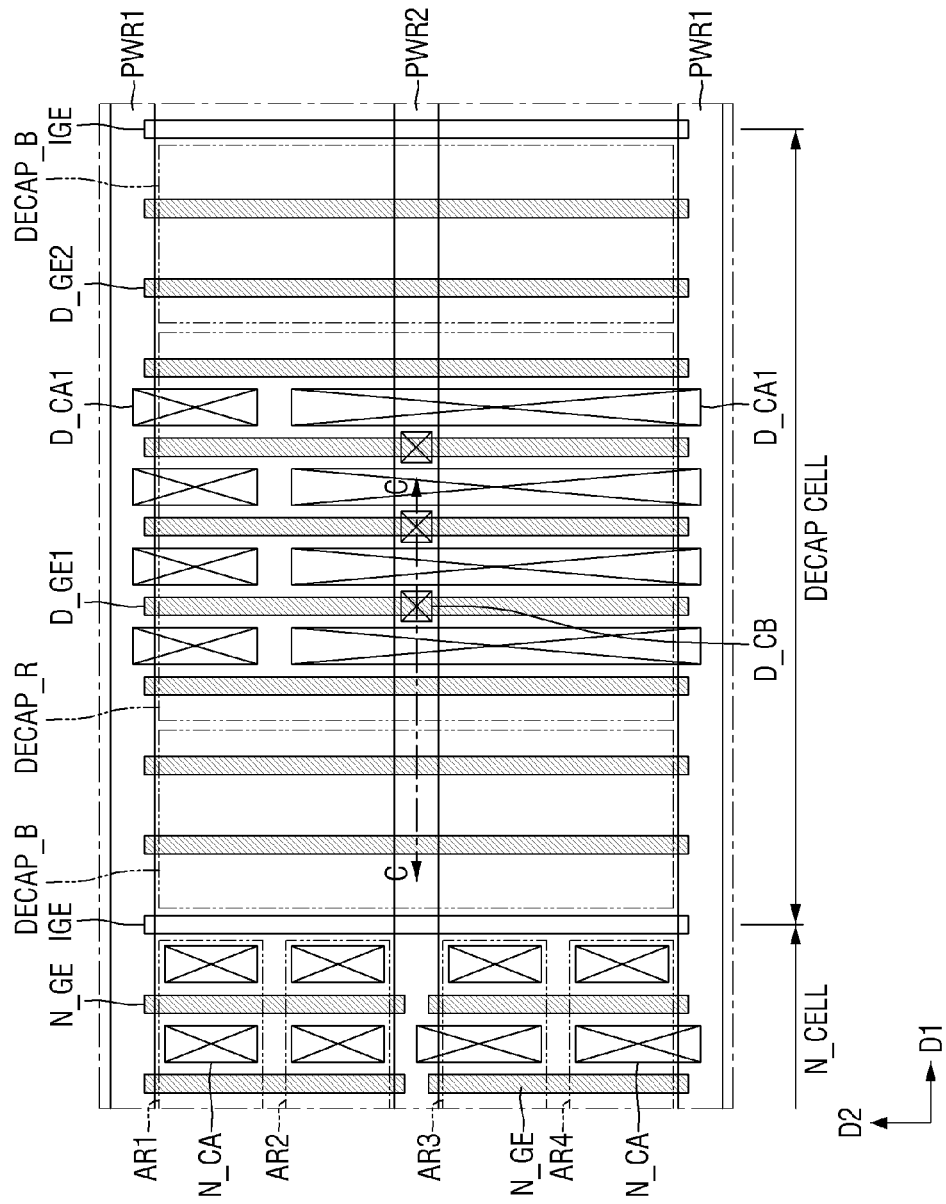
FIGS. 24 and 25 are diagrams for explaining an integrated circuit according to some embodiments.
Figure 25:
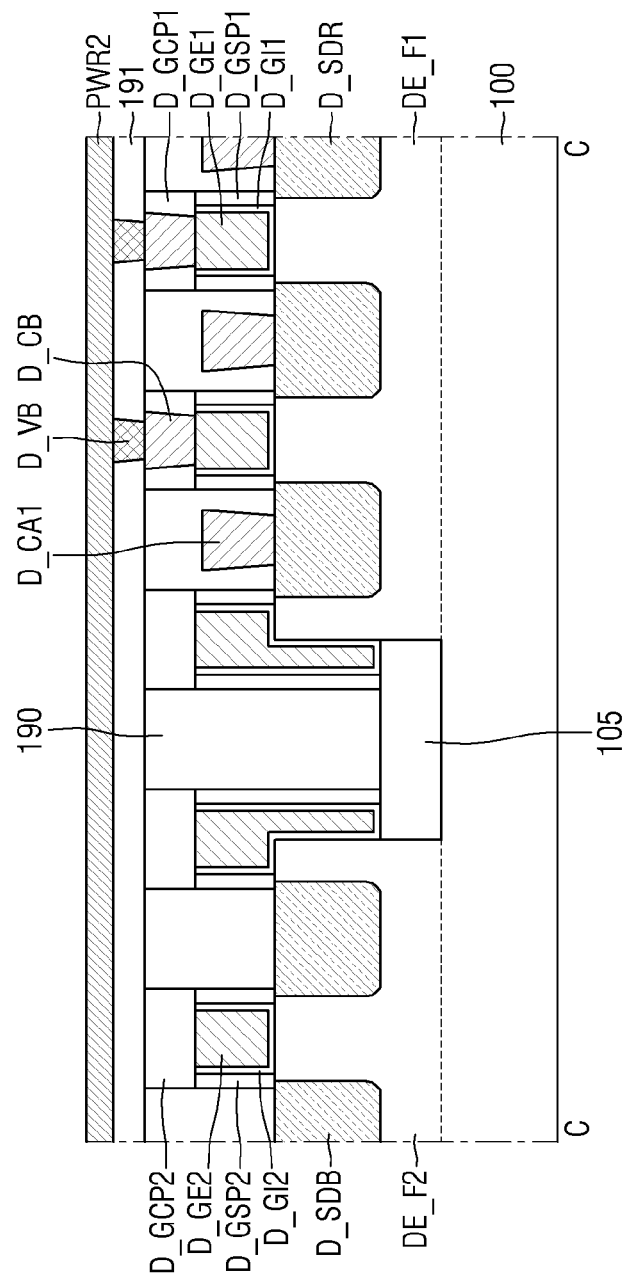

FIGS. 24 and 25 are diagrams for explaining an integrated circuit according to some embodiments. For convenience of explanation, points different from those described referring to FIGS. 2 to 10 will be mainly described. For reference, FIG. 24 is an exemplary layout diagram in which a portion P of FIG. 1 is enlarged. FIG. 25 is an exemplary cross-sectional view taken along C-C of FIG. 24.

Referring to FIGS. 24 and 25, in the integrated circuit according to some embodiments, the decoupling filler cell DECAP CELL includes a decoupling capacitor region DECAP_R and a decoupling buffer region DECAP_B, but does not include the decoupling tap region DECAP_T.

The decoupling buffer region DECAP_B may be immediately adjacent to the decoupling capacitor region DECAP_R in the first direction D1.

Figure 26:
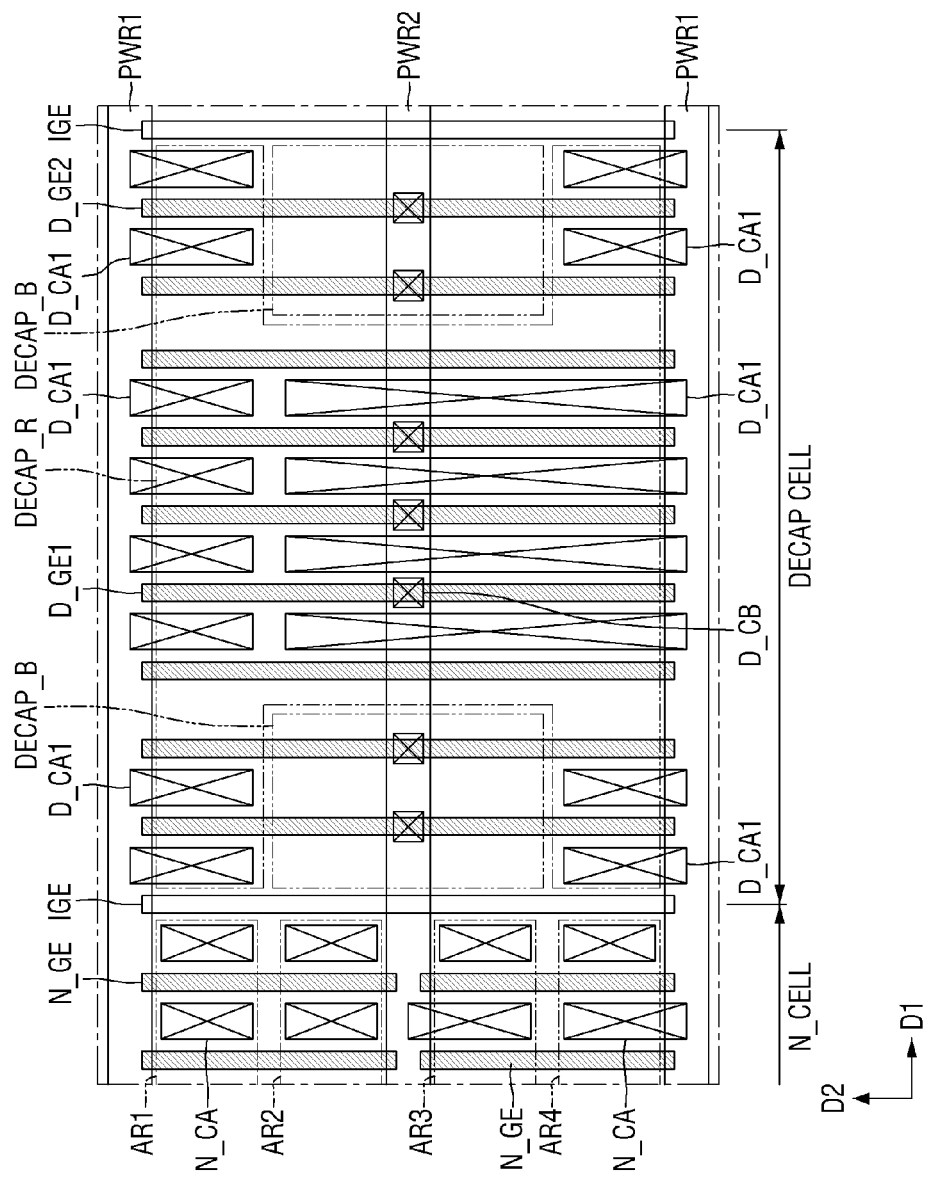
FIG. 26 is a diagram for explaining an integrated circuit according to some embodiments.

FIG. 26 is a diagram for explaining an integrated circuit according to some embodiments. For convenience of explanation, points different from those described referring to FIGS. 19 to 23 will be mainly described.

Referring to FIG. 26, in the integrated circuit according to some embodiments, the decoupling filler cell DECAP CELL does not include the decoupling tap region DECAP_T.

The decoupling filler cell DECAP CELL may include only the decoupling capacitor region DECAP_R and the decoupling buffer region DECAP_B.

Hereinafter, a layout design method of the integrated circuit and a method for fabricating the integrated circuit according to the exemplary embodiments will be described referring to FIGS. 27 and 28.

Figure 27:
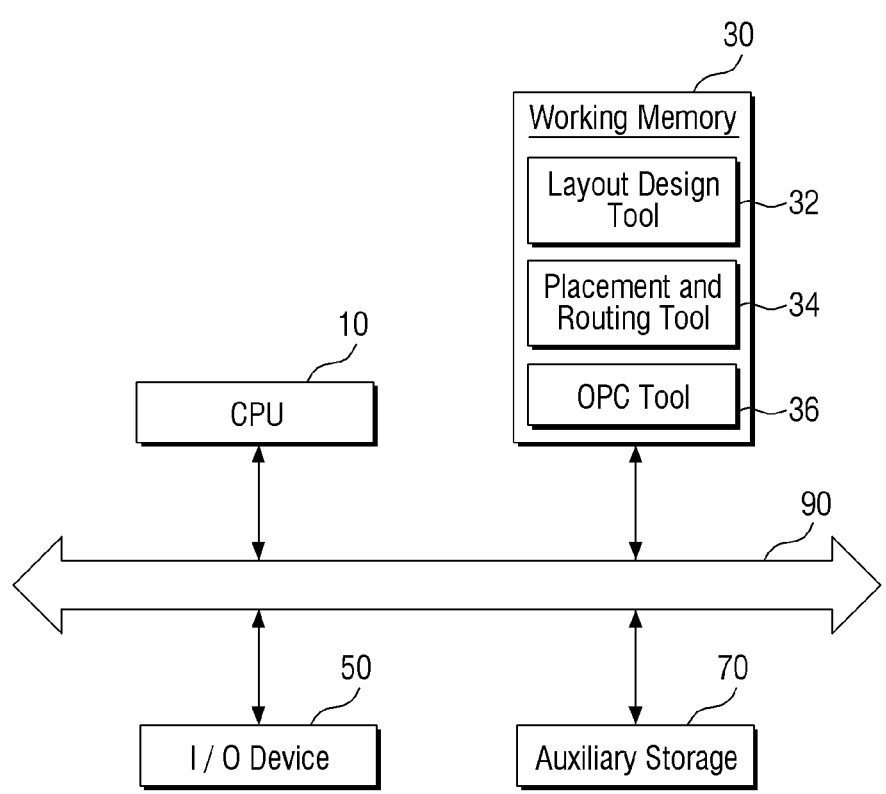
FIG. 27 is a block diagram of a computer system for performing a layout design of the integrated circuit according to some embodiments.

FIG. 27 is a block diagram of a computer system for performing a layout design of the integrated circuit according to some embodiments.

Referring to FIG. 27, the computer system may include a CPU 10, a working memory 30, an I/O device 50, and an auxiliary storage 70. Here, the computer system may be provided as a dedicated device for layout design of the integrated circuit according to some embodiments. In some embodiments, the computer system may also include various design and verification simulation programs.

The CPU 10 may execute software (application programs, operating systems, and device drivers) that runs on a computer system. The CPU 10 may execute the operating system loaded into the working memory 30. The CPU 10 may execute various application programs to be driven on the basis of operating system. For example, the CPU 10 may execute a layout design tool 32, a placement and routing tool 34 and/or an OPC tool 36 loaded into the working memory 30.

The aforementioned operating system or application programs may be loaded into the working memory 30. Although it is not shown, the operating system image stored in the auxiliary storage 70 may be loaded into the working memory 30 on the basis of the booting sequence when the computer system boots up. The operating system may support various input/output operations of the computer system.

The layout design tool 32 for layout design of the integrated circuit according to some embodiments may be loaded from the auxiliary storage 70 into the working memory 30. Subsequently, the placement and routing tool 34 which places the designed standard cells, rearranges the internal wiring pattern in the placed standard cells, and routes the placed standard cells, may be loaded from the auxiliary storage 70 into the working memory 30. Subsequently, the OPC tool 36 that performs optical proximity correction (OPC) of the designed layout data may be loaded from the auxiliary storage 70 into the working memory 30.

The I/O device 50 may control the user's input and output from the user interface devices. For example, the I/O device 50 includes a keyboard or a monitor and may receive input of information from the user. The user may receive input of information about semiconductor regions or data paths that require tuned operating properties, using the I/O device 50. In addition, the processing procedure, processing results and the like of the OPC tool 36 may be displayed through the I/O device 50.

The auxiliary storage 70 may be provided as a storage medium of the computer system. The auxiliary storage 70 may store application programs, an operating system image, and various data.

A system interconnector 90 may be a system bus for providing a network inside the computer system. The CPU 10, the working memory 30, the I/O device 50, and the auxiliary storage 70 may be electrically connected and data may be exchanged through the system interconnector 90.

Figure 28:
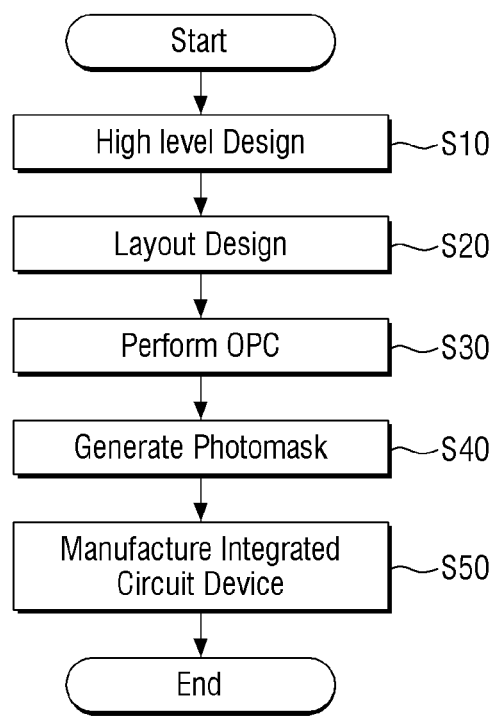
FIG. 28 is a flowchart for explaining a layout design method of the integrated circuit according to some embodiments and a method of fabricating the same.

FIG. 28 is a flowchart for explaining a layout design method of the integrated circuit according to some embodiments and a method of fabricating the same.

Referring to FIG. 28, a high-level design of the integrated circuit may be performed using the computer system described above referring to FIG. 27 (S10). The high-level design may be a description of the integrated circuit to be designed in the parent language of the computer language. For example, a parent language such as C language may be used in the high-level design. Circuits designed by the high-level design may be expressed more specifically by register transfer level (RTL) coding or simulation. Subsequently, the code generated by the register transfer level coding is converted into a Netlist and may be synthesized by the entire semiconductor element. The synthesized schematic circuit is verified by the simulation tool, and the adjustment process may be accompanied according to the verification result.

Subsequently, a layout design for implementing the logically completed integrated circuit on a silicon substrate may be performed (S20). For example, the layout design may be performed, by referring to the schematic circuit synthesized by the high-level design or Netlist corresponding thereto. The layout design may include routing procedures for placing and connecting various standard cells provided by a cell library in accordance with the defined design rules.

The layout may be a procedure which defines the shape and size of a pattern for forming the transistor and the metal wirings actually formed on the silicon substrate. For example, in order to actually form an inverter circuit on the silicon substrate, PFET, NFET, P-WELL, N-WELL, a gate electrode, and layout patterns such as wiring patterns placed on them may be appropriately placed.

Next, the selected and placed standard cells may be routed. Specifically, the upper wirings (routing patterns) may be placed on the placed standard cells. By performing the routing, the placed standard cells may be interconnected according to the design.

After routing, layout verification may be performed to determine whether there are any parts that violate the design rule. Items to be verified may include a DRC (Design Rule Check), an ERC (Electronical Rule Check), a LVS (Layout vs Schematic), and the like.

Subsequently, an optical proximity correction (OPC) procedure may be performed (S30). The layout patterns provided through the layout design may be implemented on the silicon substrate, using a photolithography process. At this time, the optical proximity correction may be a technique for correcting a distortion phenomenon that may occur in the photolithography process.

Subsequently, a photomask may be manufactured on the basis of the layout changed by the optical proximity correction (S40). The photomask may be manufactured, for example, in a manner of drawing the layout patterns, using a chrome film coated on the glass substrate.

Subsequently, an integrated circuit may be manufactured, using the generated photomask (S50). In the fabricating process of the integrated circuit using a photomask, various types of exposure and etching processes may be repeated. Through such processes, the shape of the patterns formed at the time of layout design may be continuously formed on the silicon substrate.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. An integrated circuit comprising:
first power supply lines which extend in a first direction and are spaced apart from each other in a second direction different from the first direction;
a second power supply line which extends in the first direction and is placed between the first power supply lines adjacent to each other in the second direction; and
a decoupling filler cell placed between the first power supply lines adjacent to each other in the second direction, wherein:
the decoupling filler cell includes a decoupling capacitor region formed by a gate electrode and a decap transistor including a first source/drain region of a first conductive type,
the gate electrode is connected to the second power supply line,
the first source/drain region is connected to the first power supply lines, and
the second power supply line passes through the decoupling capacitor region.

2. The integrated circuit of claim 1, wherein:
the decoupling filler cell includes a decoupling buffer region defined along a decoupling filler cell boundary extending in the second direction,
the second power supply line passes through the decoupling buffer region,
the decoupling buffer region includes a buffer source/drain region of a second conductive type different from the first conductive type, and
the buffer source/drain region is in a floating state.

3. The integrated circuit of claim 2, wherein:
the decoupling capacitor region includes: (1) an upper capacitor region and a lower capacitor region extending in the first direction and spaced apart from each other in the second direction and (2) a connecting capacitor region which connects the upper capacitor region and the lower capacitor region, and
widths of the upper capacitor region and the lower capacitor region in the first direction are greater than a width of the connecting capacitor region in the first direction.

4. The integrated circuit of claim 3, wherein the second power supply line passes through the connecting capacitor region.

5. The integrated circuit of claim 3, wherein the decoupling buffer region is placed between the upper capacitor region and the lower capacitor region.

6. The integrated circuit of claim 2, wherein the decoupling capacitor region has an I shape.

7. The integrated circuit of claim 1, wherein:
the decoupling filler cell further includes a decoupling tap region extending in the second direction,
the second power supply line passes through the decoupling tap region,
the decoupling tap region includes a tap source/drain region of the first conductive type, and
the tap source/drain region is connected to the second power supply line.

8. The integrated circuit of claim 7, further comprising:
a standard cell which forms a boundary with the decoupling filler cell in the first direction,
the standard cell includes a second_1 transistor including a plurality of second_1 source/drain regions of the first conductive type and a second_2 transistor including a plurality of second_2 source/drain regions of a second conductive type different from the first conductive type,
one or more of the second_1 source/drain regions is connected to the first power supply lines, and
one or more of the second_2 source/drain regions is connected to the second power supply line.

9. The integrated circuit of claim 1, wherein:
the decoupling filler cell further includes a source/drain contact connected to the first source/drain region,
each of the first power supply lines includes a first_1 power supply line and a first_2 power supply line spaced apart from each other in the second direction with the decoupling filler cell interposed therebetween, and
the source/drain contact extends from the first_1 power supply line to the first_2 power supply line.

10. The integrated circuit of claim 1, wherein:
the decoupling filler cell further includes a first source/drain contact and a second source/drain contact which are connected to the first source/drain region and spaced apart from each other in the second direction,
each of the first power supply lines includes a first_1 power supply line and a first_2 power supply line spaced apart from each other in the second direction with the decoupling filler cell interposed therebetween,
the first source/drain contact is connected to the first_1 power supply line, and
the second source/drain contact is connected to the first_2 power supply line.

11. The integrated circuit of claim 1, wherein:
the decap transistor is a p-type transistor, and
the second power supply line is connected to a ground voltage.

12. The integrated circuit of claim 1, wherein:
the decap transistor is an n-type transistor, and
each of the first power supply lines is connected to a ground voltage.

13. An integrated circuit comprising:
first power supply lines which extend in a first direction and are spaced apart from each other in a second direction different from the first direction;
a second power supply line which extends in the first direction and is placed between the first power supply lines adjacent to each other in the second direction;
a decoupling filler cell which is placed between the first power supply lines adjacent to each other in the second direction and includes a gate electrode extending in the second direction; and
a standard cell which is placed between the first power supply line and the second power supply line and forms a boundary with the decoupling filler cell in the first direction, wherein:
the decoupling filler cell includes a decoupling capacitor region, a decoupling buffer region, and a decoupling tap region,
the decoupling buffer region is defined along a decoupling filler cell boundary extending in the second direction,
the decoupling tap region is defined between the decoupling capacitor region and the decoupling buffer region, the decoupling capacitor region is formed by the gate electrode and a decap transistor including a first source/drain region of a first conductive type, the decoupling tap region includes a tap source/drain region of the first conductive type, the decoupling buffer region includes a buffer source/drain region of a second conductive type different from the first conductive type, the standard cell has a first active region, which is adjacent to the first power supply line and has a second_1 source/drain region of the first conductive type, and a second active region which is adjacent to the second power supply line and has a second_2 source/drain region of the second conductive type, each of the gate electrode and the tap source/drain region is connected to the second power supply line, the first source/drain region is connected to the first power supply line, and the second power supply line passes through the decoupling capacitor region, the decoupling tap region, and the decoupling buffer region.

14. The integrated circuit of claim 13, wherein:
a plurality of second_2 source/drain regions are placed on the second active region, and
one or more of the plurality of second_2 source/drain regions is connected to the second power supply line.

15. The integrated circuit of claim 13, wherein:
the decoupling capacitor region includes: (1) an upper capacitor region and a lower capacitor region extending in the first direction and spaced apart from each other in the second direction and (2) a connecting capacitor region which connects the upper capacitor region and the lower capacitor region, and
widths of the upper capacitor region and the lower capacitor region in the first direction are greater than a width of the connecting capacitor region in the first direction.

16. The integrated circuit of claim 15, wherein the second power supply line passes through the connecting capacitor region.

17. The integrated circuit of claim 13, wherein:
the decoupling filler cell includes:
a first multi-channel active pattern extending in the first direction and placed in the decoupling capacitor region, and
a second multi-channel active pattern extending in the first direction and placed in the decoupling tap region and the decoupling buffer region, and
the first multi-channel active pattern is spaced apart from the second multi-channel active pattern in the first direction and arranged in the first direction.

18. The integrated circuit of claim 17, wherein the gate electrode includes a first gate electrode and a second gate electrode which intersect an end of the first multi-channel active pattern and an end of the second multi-channel active pattern which face each other.

19. An integrated circuit comprising:
first power supply lines which extend in a first direction and are spaced apart from each other in a second direction different from the first direction;
a second power supply line which extends in the first direction and is placed between the first power supply lines adjacent to each other in the second direction; and
a decoupling filler cell placed between the first power supply lines adjacent to each other in the second direction, wherein:
the decoupling filler cell includes a plurality of gate electrodes extending in the second direction and first multi-channel active patterns and second multi-channel active patterns extending in the first direction,
each of the second multi-channel active patterns is separated from a corresponding first multi-channel active pattern in the first direction,
the decoupling filler cell includes a decoupling capacitor region, a decoupling buffer region, and a decoupling tap region,
the decoupling buffer region is defined along a decoupling filler cell boundary extending in the second direction,
the decoupling tap region is defined between the decoupling capacitor region and the decoupling buffer region,
the decoupling capacitor region is formed by a first multi-channel active pattern among the first multi-channel active pattern, the gate electrode, and a p-type transistor including a p-type source/drain region on the first multi-channel active pattern,
the decoupling tap region includes a p-type tap source/drain region on a second multi-channel active pattern among the second multi-channel active pattern,
the decoupling buffer region includes an n-type buffer source/drain region on a second multi-channel active pattern among the second multi-channel active pattern,
the gate electrode of the p-type transistor is connected to the second power supply line,
each of the p-type source/drain region and the p-type tap source/drain region of the p-type transistor is connected to the first power supply line, and
the second power supply line is connected to a ground voltage.

20. The integrated circuit of claim 19, wherein the second power supply line passes through the decoupling capacitor region, the decoupling tap region, and the decoupling buffer region.

* * * * *